(12) United States Patent
Tanizaki et al.

(10) Patent No.: US 6,856,537 B2
(45) Date of Patent: Feb. 15, 2005

(54) THIN FILM MAGNETIC MEMORY DEVICE HAVING DUMMY CELL

(75) Inventors: Hiroaki Tanizaki, Hyogo (JP); Takaharu Tsuji, Hyogo (JP); Tsukasa Ooishi, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 10/299,776

(22) Filed: Nov. 20, 2002

(65) Prior Publication Data

US 2003/0223268 A1 Dec. 4, 2003

(30) Foreign Application Priority Data

May 30, 2002 (JP) .......................... 2002-157648

(51) Int. Cl.⁷ .......................... G11C 11/00; G11C 11/14; G11C 11/15
(52) U.S. Cl. .......................... 365/158; 365/171; 365/173
(58) Field of Search .............................. 365/158, 171, 365/173

(56) References Cited

U.S. PATENT DOCUMENTS

| | | | | |
|---|---|---|---|---|
| 5,894,447 A | * | 4/1999 | Takashima | .................. 365/158 |
| 6,055,178 A | | 4/2000 | Naji | ........................... 365/158 |
| 6,382,823 B1 | | 5/2002 | Naji | |
| 6,466,475 B1 | * | 10/2002 | Nickel | ......................... 365/171 |
| 6,504,752 B2 | * | 1/2003 | Ito | .............................. 365/171 |
| 6,587,371 B1 | * | 7/2003 | Hidaka | ....................... 365/173 |

OTHER PUBLICATIONS

"A 10ns Read and Write Non–Volatile Memory Array Using a Magnetic Tunnel Junction and FEI Switch in Each Cell", Scheuerlein et al., ISSCC Digest of Technical Papers, TA 7.2, Feb. 2000, pp. 94–95, 128–129, 409–410.
"Nonvolatile RAM based on Magnetic Tunnel Junction Elements", Durlam et al., ISSCC Digest of Technical Papers, TA 7.3, Feb. 2000, pp. 96–97, 130–131, 410–411.
"A 256kb 3.0V 1T1MTJ Nonvolatile Magnetoresistive RAM", Naji et al., ISSCC Digest of Technical Papers, TA 7.6, Feb. 2001, pp. 94–95, 122–123, 404–405, 438.

* cited by examiner

Primary Examiner—Trong Phan
(74) Attorney, Agent, or Firm—McDermott Will & Emery LLP

(57) ABSTRACT

A dummy cell has a plurality of dummy magneto-resistance elements which have the same characteristic as a magneto-resistance element, which characteristic changes corresponding to a voltage applied to the opposite ends. In addition, a voltage applied to opposite ends of each dummy magneto-resistance element is made smaller than a voltage applied to opposite ends of a magneto-resistance element of a memory cell. With this, the dummy cell is designed so as to have an intermediate electric resistance between first and second electric resistances.

13 Claims, 25 Drawing Sheets

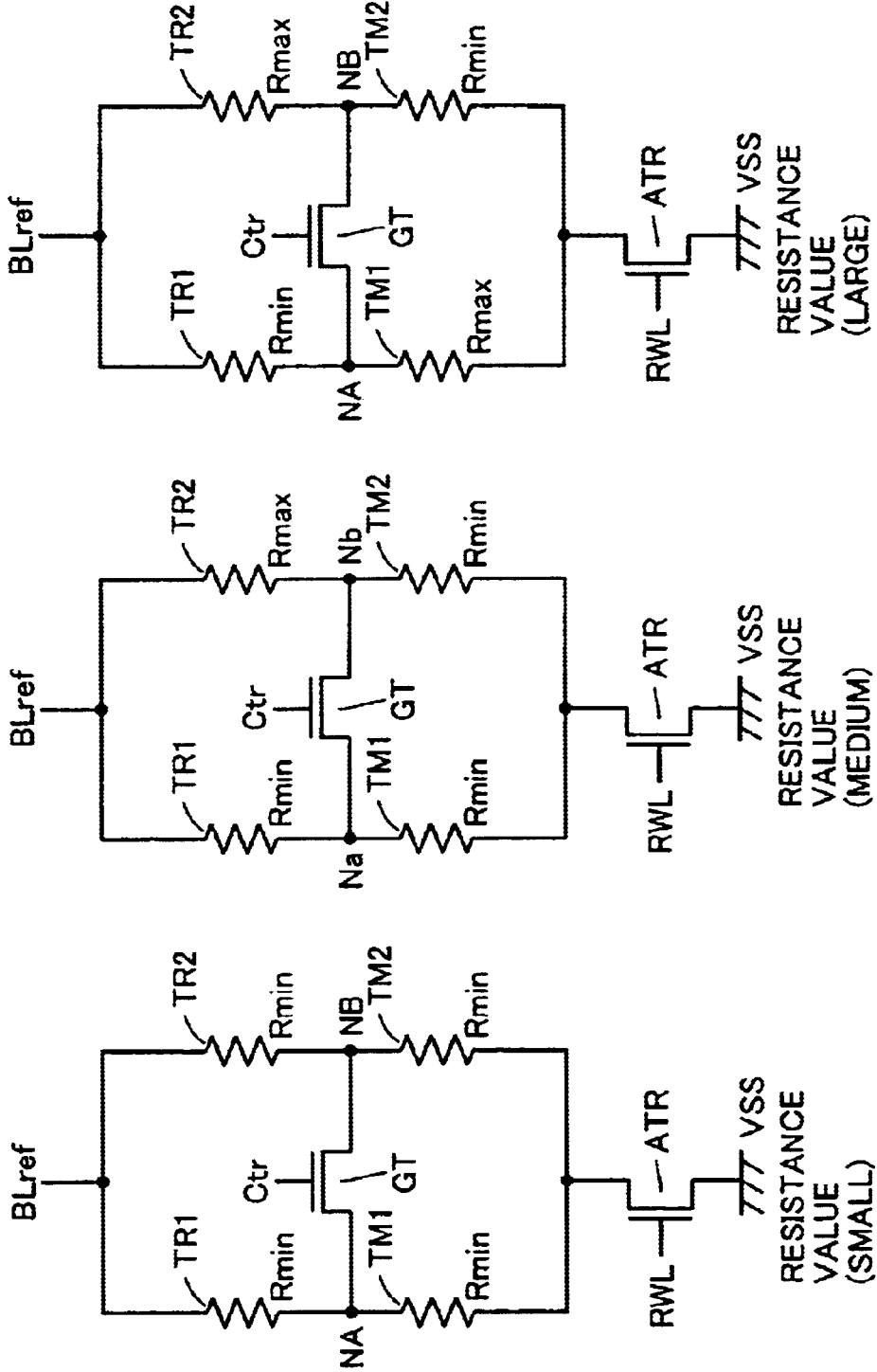

THIN FILM MAGNETIC MEMORY DEVICE HAVING DUMMY CELL

BACKGROUND OF THE INVENTION

1. Field of the Invention

The present invention relates to a thin film magnetic memory device and, more specifically, to a randomly accessible thin film magnetic memory device including a memory cell having a magnetic tunneling junction (MTJ).

2. Description of the Background Art

An MRAM (Magnetic Random Access Memory) device is recognized as a memory device capable of non-volatile data storing with low power consumption. The MRAM device performs non-volatile data storing using a plurality of thin film magnetic elements formed on a semiconductor integrated circuit, and is randomly accessible for each thin film magnetic element.

Recently, it is reported that the performance of the MRAM device is dramatically improved when a tunneling magneto-resistance element utilizing a magnetic tunnel junction (MTJ) is used as a memory cell. The MRAM device including a memory cell having a magnetic tunnel junction is disclosed in references such as "A 10 ns Read and Write Non-Volatile Memory Array Using a Magnetic Tunnel Junction and FET Switch in each Cell", ISSCC Digest of Technical Papers, TA7.2, February 2000, "Nonvolatile RAM Based on Magnetic Tunnel Junction Elements", ISSCC Digest of Technical Papers, TA7.3, February 2000, and "A 256kb 3.0V 1T1MTJ Nonvolatile Magnetoresistive RAM", ISSCC Digest of Technical Papers, TA7.6, February 2001.

FIG. 25 schematically shows a structure of a memory cell (MC) having a magnetic tunnel junction (also referred to as an MTJ memory cell hereinafter).

Referring to FIG. 25, the MTJ memory cell includes a tunneling magneto-resistance element TMR which changes in an electric resistance value corresponding to a data level of stored data, and an access transistor ATR. Access transistor ATR is formed with a field-effect transistor, and is coupled between tunneling magneto-resistance element TMR and a ground voltage VSS.

A write word line WWL for directing data writing, a read word line RWL for directing data reading, and a bit line BL which is a data line for transferring an electric signal corresponding to a level of stored data at data reading and data writing are arranged in the MTJ memory cell.

FIG. 26 is a schematic diagram showing a data reading operation from the MTJ memory cell. First, a structure of tunneling magneto-resistance element TMR is described.

Referring to FIG. 26, the tunneling magneto-resistance element has an MR (Magneto-Resistive) effect, with which an electric resistance of a substance is changed corresponding to a direction of magnetization of a magnetic element. Tunneling magneto-resistance element TMR is characterized in that, it has a significant MR effect even at ordinary temperatures, and has a high MR ratio (an electric resistance ratio corresponding to the direction of magnetization).

Tunneling magneto-resistance element TMR includes ferromagnetic films FL and VL and an insulator film (tunneling film) TB. In tunneling magneto-resistance element TMR, an amount of tunneling current flowing through insulator film TB which is sandwiched between ferromagnetic films FL and VL changes with a direction of electron spin, which direction is determined by the directions of magnetization of ferromagnetic films FL and VL. Because the number of states possible for the spinning electrons within ferromagnetic films FL and VL differs depending on the directions of magnetization, the tunneling current increases when ferromagnetic films FL and VL have the same direction of magnetization, while the tunneling current decreases when these two films have opposite directions of magnetization.

Utilizing this phenomenon, the tunneling magneto-resistance element TMR can be used as a memory cell storing 1 bit data, when the direction of magnetization of ferromagnetic film FL is fixed while the direction of magnetization of ferromagnetic film VL is changed corresponding to the stored data, and the amount of the tunneling current flowing through tunneling film TB, i. e., the electric resistance of tunneling magneto-resistance element TMR is detected. The direction of magnetization of ferromagnetic film FL, which is fixed by an antiferromagnetic material or the like, is commonly referred to as "a spin valve".

Hereinafter, ferromagnetic film FL having a fixed direction of magnetization is also referred to as a fixed magnetic film FL, and ferromagnetic film VL having a direction of magnetization corresponding to stored data is also referred to as a free magnetic film VL. In tunneling magneto-resistance element TMR, the side of free magnetic film VL which is electrically coupled to bit line BL is also referred to as a positive electrode (+), and the side of fixed magnetic film FL which is electrically coupled to access transistor ATR is also referred to as a negative electrode (−).

On data reading, access transistor ATR is turned on in response to activation of read word line RWL. With this, a sense current Is, which is fed as a constant current from a control circuit, not shown, flows through a current path from bit line BL to tunneling magneto-resistance element TMR, access transistor ATR, and ground voltage VSS.

As described above, the electric resistance value of tunneling magneto-resistance element TMR changes corresponding to a relation between the directions of magnetization of fixed magnetic film FL and free magnetic film VL. More specifically, when the direction of magnetization of fixed magnetic film FL is the same as the direction of magnetization written to free magnetic film VL, the electric resistance value of tunneling magneto-resistance element TMR will become smaller than the situation when they have different directions of magnetization. In this specification, the electric resistance values of the tunneling magneto-resistance element corresponding to "1" and "0" of stored data will be indicated by Rmax and Rmin, respectively. Herein, it is assumed that Rmax>Rmin, and that Rmax=Rmin+ΔR.

Thus, the electric resistance value of tunneling magneto-resistance element TMR changes corresponding to the magnetic field applied from the outside. Therefore, data storing can be performed based on the change characteristic of the electric resistance value of tunneling magneto-resistance element TMR. Generally, the electric resistance value of tunneling magneto-resistance element TMR applied to the MRAM device is about several tens Ω.

The change in voltage in tunneling magneto-resistance element TMR, which change is generated by sense current Is, differs corresponding to the direction of magnetization stored in free magnetic film VL. Therefore, the level of stored data of the MTJ memory cell can be read by monitoring the change in voltage level of bit line BL, if the feeding of sense current Is is started after bit line BL is precharged to a high voltage.

FIG. 27 is a schematic diagram showing a data writing operation to the MTJ memory cell.

Referring to FIG. 27, when data is written, read word line RWL is deactivated and access transistor ATR is turned off. In this state, a data write current for writing the magnetic field to free magnetic film VL flows through write word line WWL and bit line BL, respectively. The direction of magnetization of free magnetic film VL is determined by the combination of the directions of the data write current (+Iw or −Iw) respectively flowing through write word line WWL and bit line BL.

FIG. 28 is a schematic diagram showing a relation between the direction of data write current and the direction of magnetization during data writing.

Referring to FIG. 28, a magnetic field Hy shown by a vertical axis indicates a direction of a magnetic field H(BL) generated by the data write current flowing through bit line BL. On the other hand, a magnetic field Hx shown by a horizontal axis indicates a direction of a magnetic field H(WWL) generated by the data write current flowing through write word line WWL.

The direction of magnetization stored in free magnetic film VL is newly written only when the sum of magnetic fields H(BL) and H(WWL) reaches the outer region of the asteroid characteristic line shown in the drawing. That is, the direction of magnetization stored in free magnetic film VL is not updated when the magnetic field is applied which corresponds to the inner region of the asteroid characteristic line.

Therefore, the current must flow through both write word line WWL and bit line BL to update the stored data of tunneling magneto-resistance element TMR by the writing operation. The direction of magnetization once stored in tunneling magneto-resistance element TMR, i. e., the stored data is held in non-volatile manner until new data writing is performed.

Sense current Is also flows through bit line BL during the data reading operation. There is only a slim possibility, however, to wrongly rewrite the stored data of the MTJ memory cell on data reading by the effect of sense current Is, because sense current Is is generally set to be smaller than the data write current described above by about one or two orders of magnitude.

In the above-described references, a technique is disclosed to form an MRAM device, which is a random access memory, by integrating such MTJ memory cells on a semiconductor substrate.

FIG. 29 is a schematic diagram showing MTJ memory cells integrated and arranged in rows and columns.

Referring to FIG. 29, a highly-integrated MRAM device can be implemented by arranging the MTJ memory cells in rows and columns on a semiconductor substrate. In FIG. 29, the MTJ memory cells are arranged in n rows×m columns (n, m: natural numbers). For the n ×m MTJ memory cells arranged in rows and columns, n write word lines WWL1–WWLn and read word lines RWL1–RWLn as well as m bit lines BL1–BLm are arranged.

On data reading, one of read word lines RWL1–RWLn is selectively activated, and the memory cells belonging to the selected memory cell row (also referred to as "selected row" hereinafter) are electrically coupled between respective bit lines BL1–BLm and ground voltage VSS. As a result, the amount of current passing through each of bit lines BL1–BLm changes according to a stored data level of the corresponding memory cell.

Therefore, the stored data level of the selected memory cell can be read by comparing the passing current of the bit line corresponding to the selected memory cell column with a prescribed reference passing current using a sense amplifier or the like.

A dummy resistance is generally used to generate the reference passing current.

It is desirable to set the dummy resistance to the electric resistance value corresponding to the intermediate value between Rmax and Rmin, which are electric resistance values corresponding to the stored data of the memory cell selected to generate a desired passing current as a reference passing current.

To set the dummy resistance to the intermediate electric resistance value, however, a certain manufacturing process is needed, so that the process will be complicated. It is also needed to consider the variation due to the manufacturing process. Therefore, it is difficult to manufacture the dummy resistance in a simple manner.

Though there is a method of designing an ideal intermediate electric resistance value using a dummy cell as the dummy resistance, the electric resistance value of the dummy cell varies due to the voltage applied to opposite ends of the dummy cell, that is, a bias voltage. Thus, because a tunneling magneto-resistance element forming the dummy cell has a voltage dependency, there has been a situation wherein an actual electric resistance value of the dummy cell differs from the ideal intermediate electric resistance value, which made it difficult to generate the reference passing current with high precision. As a result, it has been difficult to perform high-speed and stable data reading.

SUMMARY OF THE INVENTION

An object of the present invention is to provide a thin film magnetic memory device which can perform high-speed and stable data reading, which object is accomplished by designing a dummy cell considering a dependency of a tunneling magneto-resistance element on a bias voltage to generate a high-precision reference passing current.

A thin film magnetic memory device according to one aspect of the present invention includes a plurality of memory cells holding magnetically-written stored data, first and second data lines, a dummy cell, and a data read circuit. Each memory cell includes a magneto-resistance element having one of a first electric resistance and a second electric resistance which is larger than the first electric resistance corresponding to the stored data. Each of the first and second electric resistances has a characteristic which changes corresponding to a voltage applied to opposite ends of the magneto-resistance element. On data reading, the first data line is connected to a first voltage, and is also connected to a second voltage via a selected memory cell among the plurality of memory cells to receive a data read current. The dummy cell is designed so as to have an intermediate electric resistance between the first and second electric resistances. On data reading, the second data line is connected to the first voltage, and is also connected to the second voltage via the dummy cell to receive the data read current. The data read circuit generates read data based on a difference in the passing currents between the first and second data lines. The dummy cell includes a plurality of dummy magneto-resistance elements each having substantially the same characteristic as the magneto-resistance element. Each dummy magneto-resistance element is connected to the second data line via another dummy magneto-resistance element connected in series. The voltage applied to opposite ends of each dummy magneto-resistance element is smaller than that applied to the magneto-resistance element.

Thus, the main advantage of the present invention is to form the dummy cell with a plurality of dummy magneto-resistance elements, to make the voltage applied to opposite ends of each dummy magneto-resistance element smaller than that applied to the magneto-resistance element, and to design the dummy cell so as to have an intermediate electric resistance between the first and second electric resistances. With this, when the magneto-resistance element of the memory cell has a characteristic which changes corresponding to the voltage applied to opposite ends, an ideal intermediate resistance value can be set because the intermediate electric resistance is designed according to that characteristic, and the stable and high-speed data reading can be performed.

A thin film magnetic memory device according to another aspect of the present invention includes a plurality of memory cells arranged in rows and columns, each memory cell holding magnetically-written stored data, a plurality of read word lines, a plurality of first data lines, a second data line, a dummy cell, and a data read circuit. The plurality of read word lines are provided corresponding to the respective rows of the plurality of memory cells, and are selectively activated on data reading. The plurality of first data lines are provided corresponding to the respective columns of the plurality of memory cells, and each is selectively connected to the selected memory cell among the plurality of memory cells and receives the data read current on data reading. Each memory cell includes a magneto-resistance element having one of a first electric resistance and a second electric resistance which is larger than the first electric resistance corresponding to the stored data, and an access element which is connected with the magneto-resistance element in series between the corresponding first data line and a prescribed voltage and which is turned on in response to activation of the corresponding read word line. Each of the first and second electric resistances has a characteristic which changes corresponding to the voltage applied to opposite ends of the magneto-resistance element. The dummy cell is designed to have an intermediate electric resistance between the first and second electric resistances. On data reading, the second data line is connected to the dummy cell and allows the data read current to pass therethrough. The data read circuit generates read data based on a difference in the passing currents between one of the plurality of first data lines and the second data line. Each dummy cell is arranged along the column direction so as to share the memory cell row with the plurality of memory cells, and includes a plurality of dummy cell units which are divided into a plurality of groups each having a prescribed number of the units. Each dummy cell unit is arranged corresponding to the memory cell row so as to share the second data line. Each dummy cell unit has a first dummy magneto-resistance element connected between the second data line and an inner node, and a dummy access element which is turned on in response to activation of the corresponding read word line and electrically couples the prescribed voltage to the first dummy magneto-resistance element. The inner node is electrically coupled to each inner node within another dummy cell unit which belongs to the same group among the plurality of groups.

Therefore, an advantage of the present invention is to form each dummy cell to include a prescribed number of dummy cell units among the plurality of dummy cell units arranged along the column direction so as to share the memory cell row. In addition, the inner node within the dummy cell unit belonging to the group of prescribed number of units is electrically coupled to the inner node of another dummy cell unit. With this, the dummy cell can be formed, sharing the dummy magneto-resistance element arranged by making a prescribed number of memory cell rows as one group. Therefore, it is unnecessary to arrange a plurality of dummy magneto-resistance elements for each memory cell row to provide a dummy cell, and the memory array area of the dummy cell can be made smaller, as the dummy magneto-resistance element is shared.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7A, 7B and 7C show examples of other variations of the dummy cell.

DESCRIPTION OF THE PREFERRED EMBODIMENTS

Figure 1:
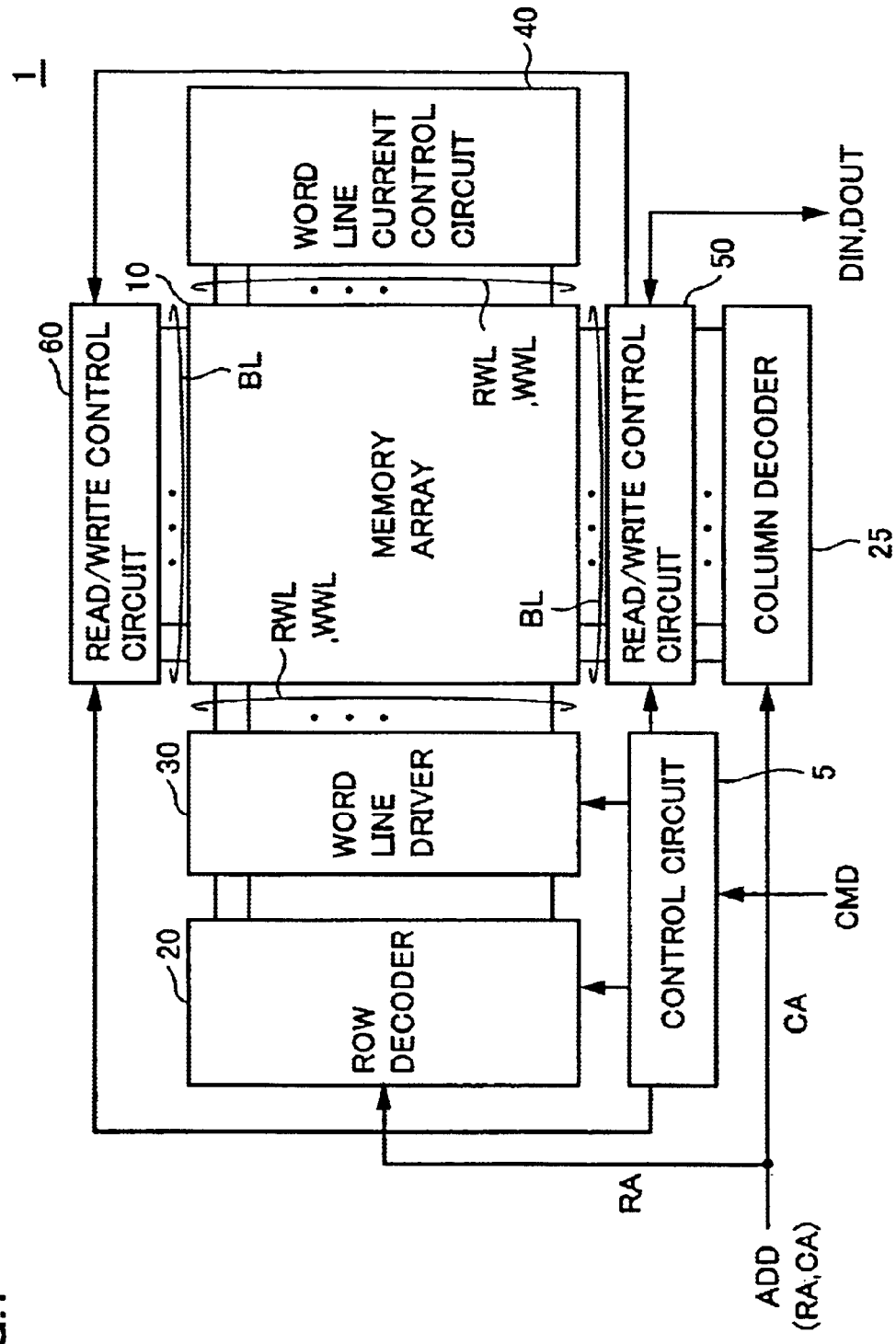
FIG. 1 is a schematic block diagram showing a whole configuration of an MRAM device according to a first embodiment of the present invention.

Embodiments of the present invention will now be described in detail with reference to the drawings. The same or corresponding portions in the drawings are indicated by the same characters, and the descriptions thereof will not be repeated.

(First Embodiment)

Referring to FIG. 1, an MRAM device 1 according to a first embodiment of the present invention performs a random access in response to a control signal CMD and an address signal ADD from the outside, and performs an input of write data DIN and an output of read data DOUT.

MRAM device 1 includes a control circuit 5 controlling an overall operation of MRAM device 1 in response to control signal CMD, and a memory array 10 having a plurality of MTJ memory cells arranged in rows and columns. A structure of memory array 10 will be described in detail below. To put it briefly, a plurality of write word lines WWLs and read word lines RWLs are arranged respectively corresponding to rows of MTJ memory cells. Bit lines BLs are also arranged respectively corresponding to columns of MTJ memory cells.

MRAM device 1 further includes a row decoder 20, a column decoder 25, a word line driver 30, a word line current control circuit 40, and read/write control circuits 50 and 60.

Row decoder 20 performs a row selection in memory array 10 corresponding to a row address RA indicated by address signal ADD. Column decoder 25 performs a column selection in memory array 10 corresponding to a column address CA indicated by address signal ADD. Word line driver 30 selectively activates read word line RWL or write word line WWL based on the result of the row selection of row decoder 20. The selected memory cell which is specified as a target for data reading or data writing operation is indicated by row address RA and column address CA.

Word line current control circuit 40 is provided to cause a data write current to flow through write word line WWL during data writing. The data write current can flow through the write word line selectively coupled to a power supply voltage VCC via word line driver 30 by, for example, coupling each write word line WWL to ground voltage VSS via word line current control circuit 40. Read/write control circuit 50, 60 generally represents circuitry or the like which is arranged in a region adjacent to memory array 10 to cause the data write current and sense current (data read current) to flow through the bit line on data reading and data writing.

Figure 2:
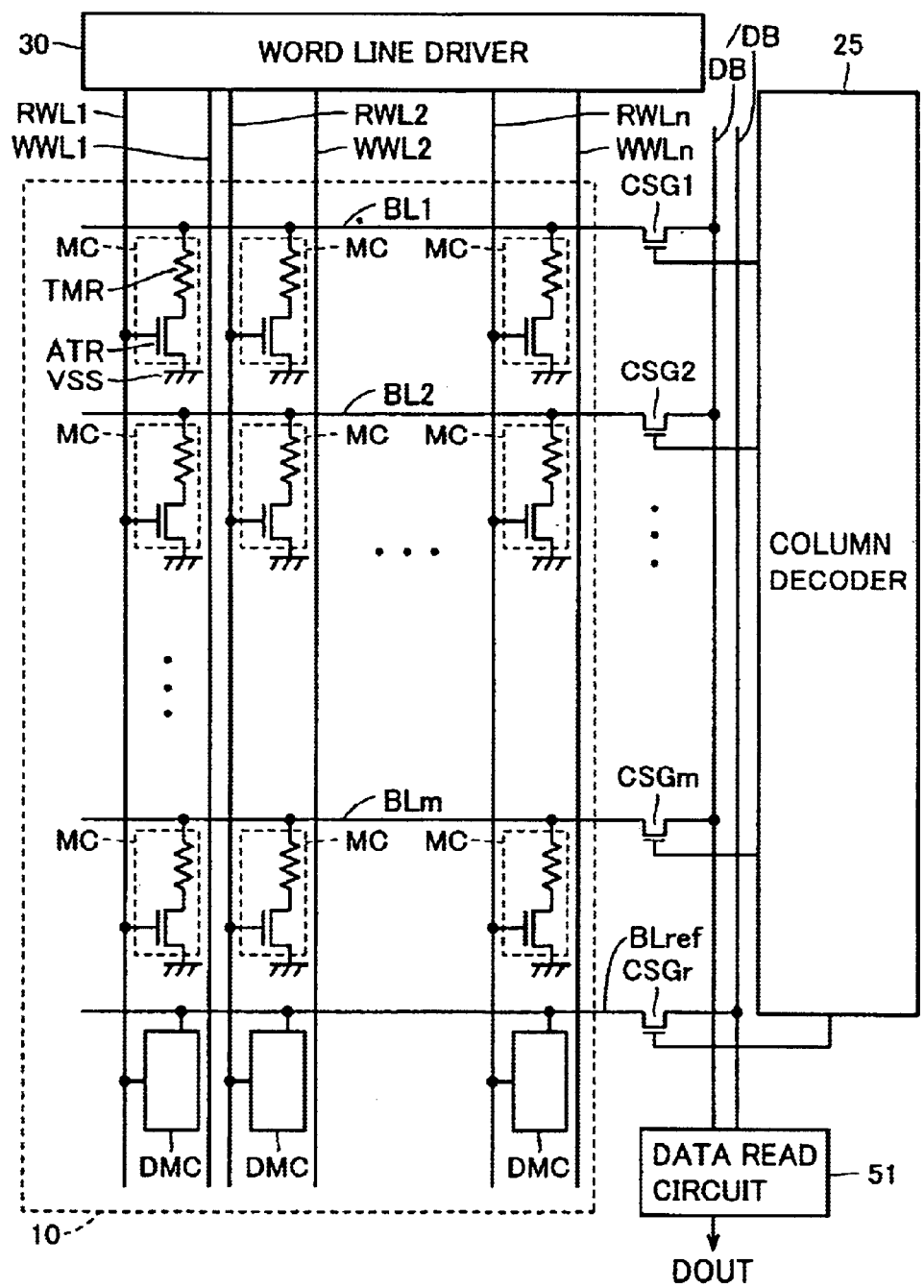
FIG. 2 shows structures of a memory array and a peripheral circuit thereof according to the first embodiment.

FIG. 2 mainly shows a structure associated with data reading.

Figure 25:
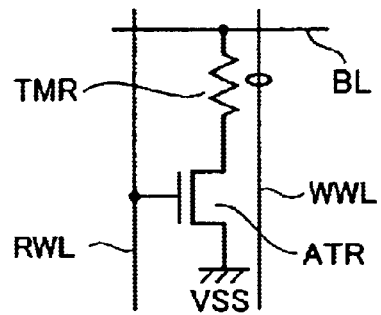
FIG. 25 is a schematic diagram showing a structure of a memory cell having a magnetic tunnel junction.
Figure 26:
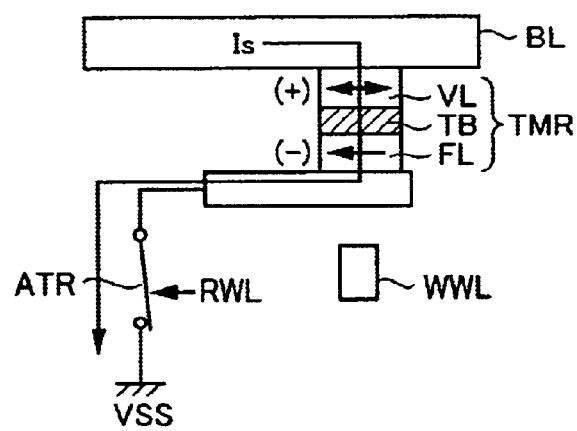
FIG. 26 is a schematic diagram showing a data reading operation from the MTJ memory cell.
Figure 27:
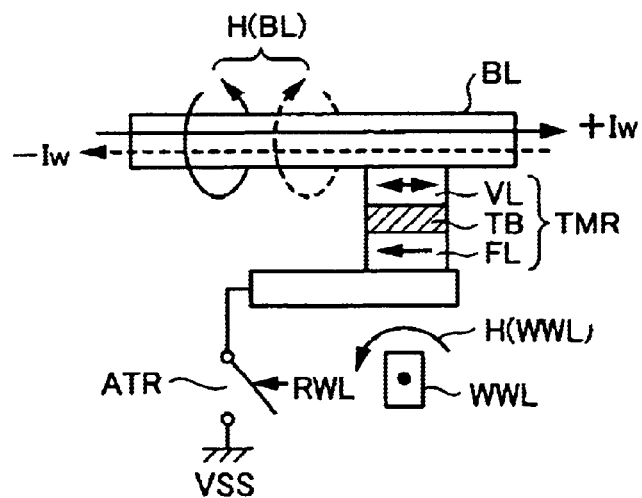
FIG. 27 is a schematic diagram showing a data writing operation to the MTJ memory cell.
Figure 28:
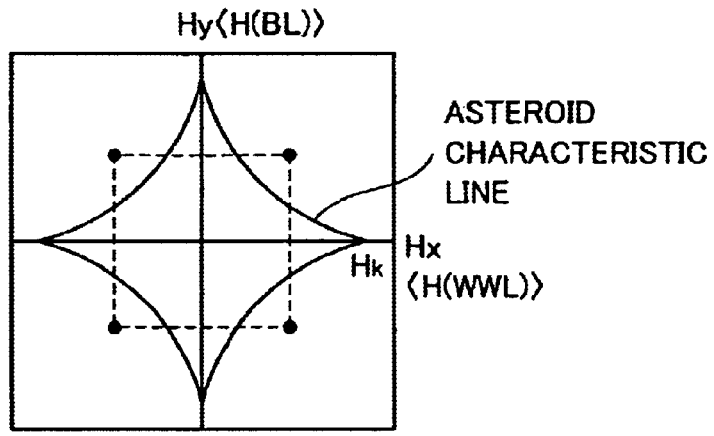
FIG. 28 is a schematic diagram showing a relation between a direction of data write current and a direction of magnetization during data writing.
Figure 29:
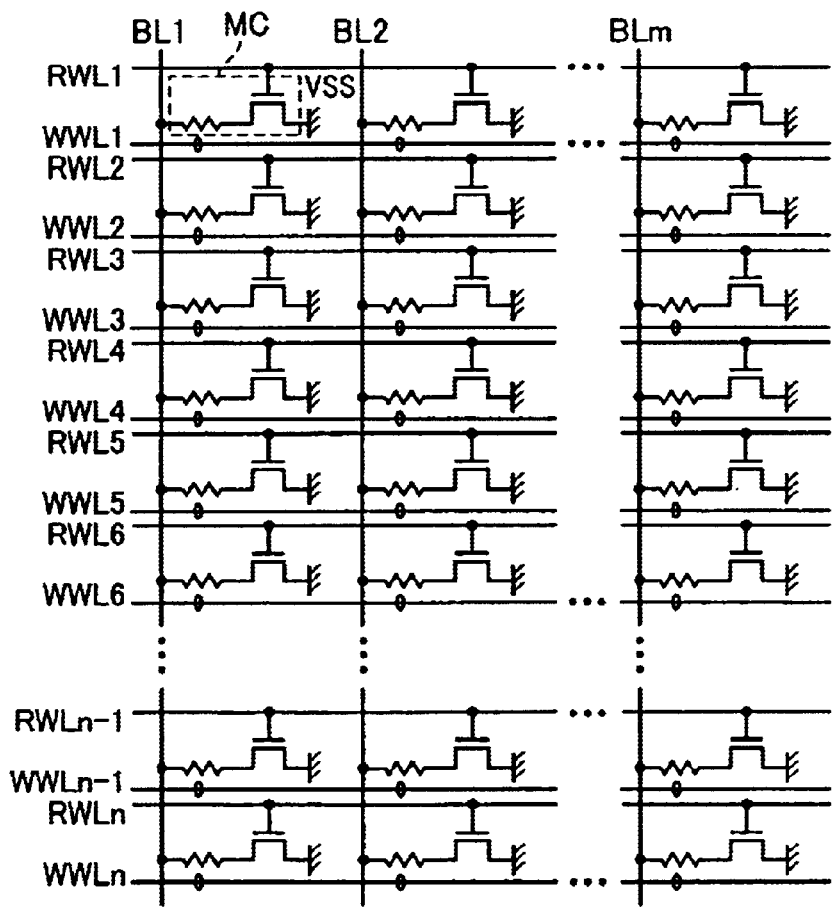
FIG. 29 is a schematic diagram showing MTJ memory cells integrated and arranged in rows and columns.

Referring to FIG. 2, memory array 10 includes MTJ memory cells MCs (also simply referred to as "memory cells MCs" hereafter) arranged in n rows×m columns and having a structure as shown in FIG. 25. Read word lines RWL1–RWLn and write word lines WWL1–WWLn are respectively provided corresponding to the rows of MTJ memory cells (also simply referred to as "memory cell rows" hereafter). Bit lines BL1–BLm are provided respectively corresponding to the columns of MTJ memory cells (also simply referred to as "memory cell columns" hereafter).

In addition, memory array 10 includes a plurality of dummy cells DMCs to form a dummy cell column. A reference bit line BLref is provided corresponding to this dummy cell column, and each dummy cell is arranged corresponding to reference bit line BLref and each row.

In FIG. 2, write word lines WWL1, WWL2, WWLn, read word lines RWL1, RWL2, RWLn, bit lines BL1, BL2, BLm, reference bit line BLref, and a part of the memory cells and dummy cells corresponding to first, second and nth rows and first, second and mth columns are representatively shown.

In the following, characters WWL, RWL and BL are used to collectively represent write word lines, read word lines and bit lines, respectively. Subscripts are added to these characters to indicate specific write word line, read word line and bit line, such as RWL1, WWL1 and BL1. In addition, a high voltage state (power supply voltage VCC) and a low voltage state (ground voltage VSS) of a signal or a signal line are also respectively referred to as "H" level and "L" level.

On data reading, word line driver 30 activates one of read word lines RWL1–RWLn to the "H" level corresponding to a decoding result, that is, a row selection result of row address RA. In response to this operation, access transistor ATR is turned on in each memory cell belonging to the selected memory cell row, and tunneling magneto-resistance element TMR in the memory cell MC is electrically coupled between corresponding bit line BL and a source-side voltage. Similarly, access transistor ATR is turned on in the dummy cell belonging to the selected memory cell row, and the tunneling magneto-resistance element in the dummy cell is electrically coupled between reference bit line BLref and the source-side voltage. In FIG. 2, an example is shown wherein the source-side voltage is set to ground voltage VSS.

Data buses DB, /DB are arranged in a region adjacent to memory array 10 along the same direction as read word line RWL and write word line WWL. Column select lines for performing a column selection are arranged corresponding to respective memory cell columns. On data reading, column decoder 25 activates one of the column select lines and the column select line corresponding to the dummy cell column respectively to the H level, corresponding to a decoding result, that is, a column selection result of column address CA. The symbol "/" shown above represents inversion, negation, being complimentary, and the like. It has the same meaning in the following.

Column select gates CSG1–CSGm are arranged between data bus DB and respective bit lines BL1–BLm. In addition, a column select gate CSGr is arranged between data bus /DB and reference bit line BLref. Each column select gate is turned on in response to activation of the corresponding column select line. Thus, data bus DB is electrically coupled to the bit line corresponding to the selected memory cell column. Data bus /DB is electrically coupled to the reference bit line corresponding to the dummy cell column.

Column select gates CSG1–CSGm are also collectively referred to as a column select gate CSG.

Data read circuit 51 outputs read data DOUT corresponding to the voltages of data buses DB, /DB.

Figure 3:
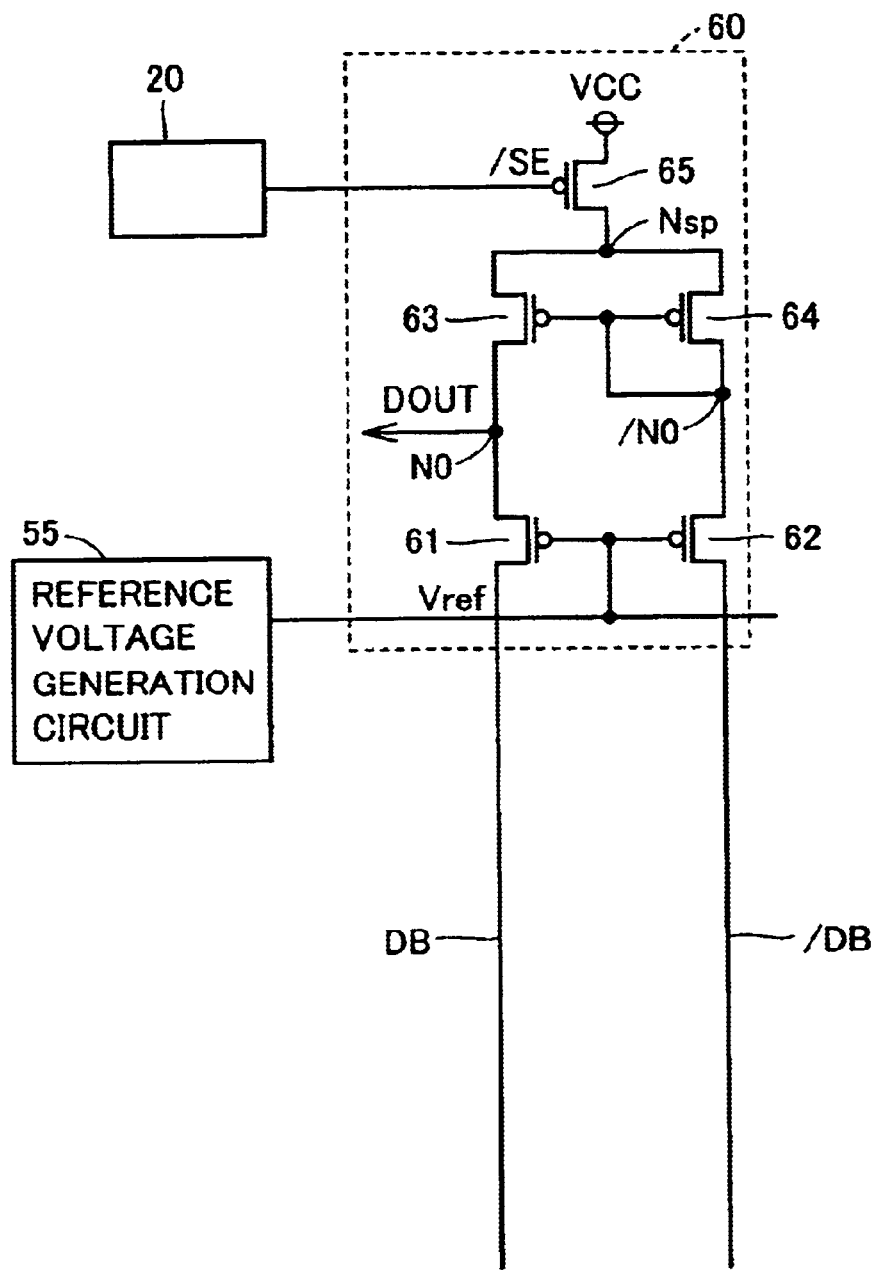
FIG. 3 shows a structure of a data read circuit.

Referring to FIG. 3, data read circuit 51 includes a differential amplifier 60 and a reference voltage generation circuit 55 generating a fixed reference voltage Vref.

Differential amplifier 60 has an N channel MOS transistor 61 connected between a node N0 and data bus DB, an N channel MOS transistor 62 connected between a node /N0 and data bus /DB, a P channel MOS transistor 63 connected between nodes Nsp and N0, a P channel MOS transistor 64 connected between nodes Nsp and /N0, and an N channel MOS transistor 65 connected between power supply voltage VCC and node Nsp.

A sense enable signal /SE which is activated to the "L" level in a data reading operation is input to the gate of transistor 65 by row decoder 20. Transistor 65 supplies an operating current to operate differential amplifier 60 in response to the activation (to the "L" level) of sense enable signal /SE.

Each gate of transistors 63 and 64 is connected to node /N0. Transistors 63 and 64 form a current mirror circuit and try to supply equal current to each of nodes N0 and /N0.

Fixed reference voltage Vref generated by reference voltage generation circuit 55 is input to each gate of transistors 61 and 62. Transistors 61 and 62 maintain the voltages of data buses DB and /DB equal to or below the reference voltage and, at the same time, amplify the difference in the passing currents between data buses DB and /DB and convert it to the difference in voltages between nodes N0 and /N0. Read data DOUT is output from node N0.

Figure 4:
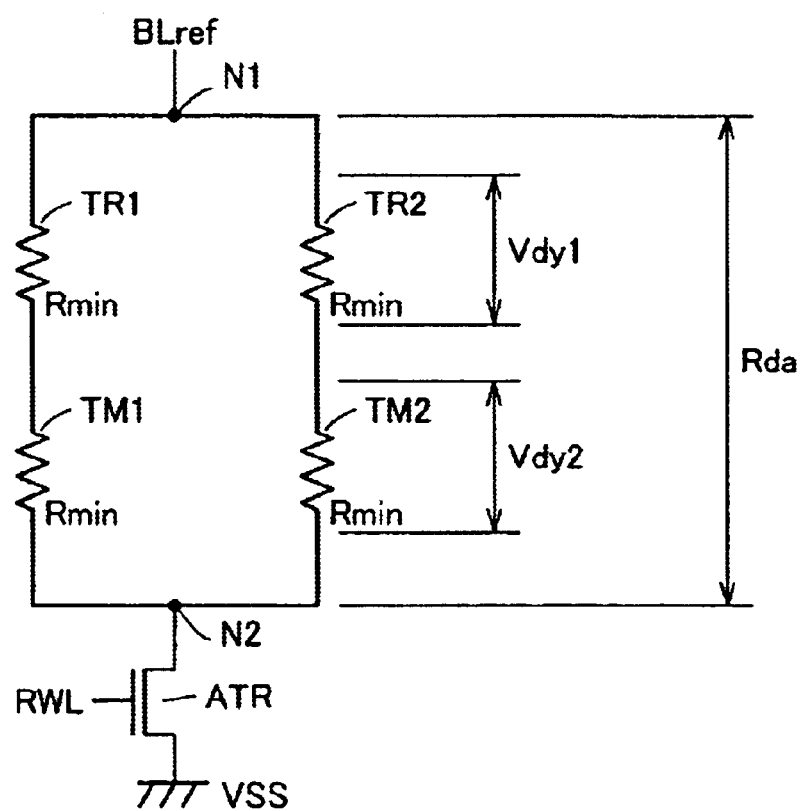
FIG. 4 shows a structure of a dummy cell according to the first embodiment of the present invention.

Referring to FIG. 4, a dummy cell according to the first embodiment of the present invention includes tunneling magneto-resistance elements TR1, TR2, TM1, TM2 and access transistor ATR.

In the dummy cell according to the first embodiment of the present invention, tunneling magneto-resistance elements are arranged all of which have the characteristic of electric resistance value Rmin of an initial state.

Figure 5:
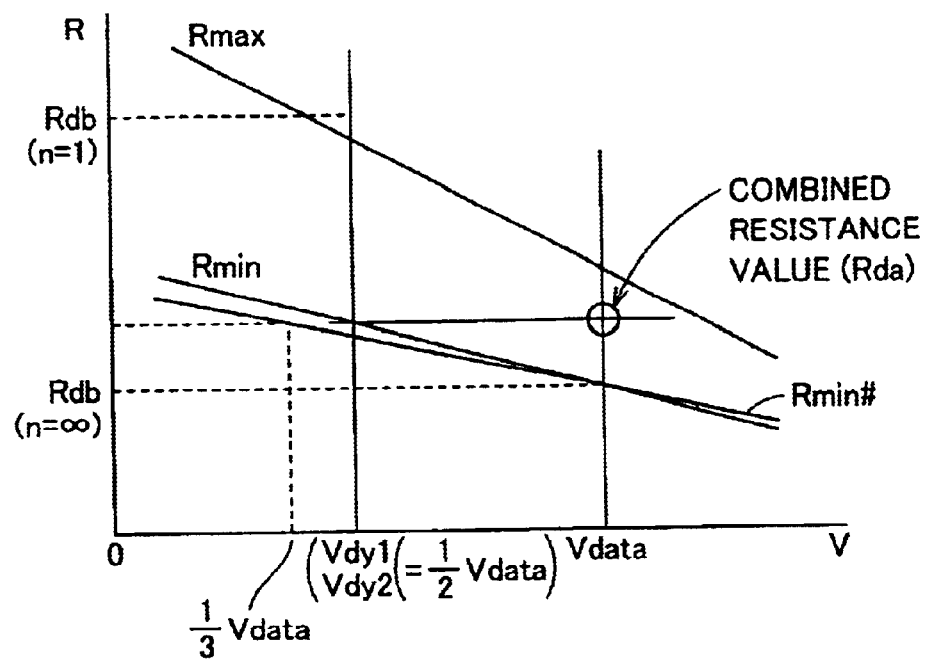
FIG. 5 shows characteristics of electric resistances Rmax and Rmin.

Referring to FIGS. 4 and 5, bias voltages Vdy1 and Vdy2 respectively applied to tunneling magneto-resistance elements TR1 (TR2) and TM1 (TM2) will become equal, and are set to a value Vdata/2. Therefore, the electric resistance value of each tunneling magneto-resistance element is equally set.

Thus, a combined resistance value Rda of this dummy cell corresponds to a resistance value when the voltage Vdata/2 is applied to one tunneling magneto-resistance element having the characteristic of electric resistance value Rmin.

As shown in FIG. 5, this value can be set to approximately the desired intermediate resistance value between electric resistance values Rmax and Rmin when bias voltage Vdata is applied to the selected memory cell.

Therefore, a high-precision intermediate resistance value can be set by designing a dummy cell considering a characteristic of a tunneling magneto-resistance element. By using this dummy cell, it is possible to ensure a sufficient difference in resistances, that is, a difference in passing currents between the dummy cell and the selected memory cell, and thus a high-speed and stable data reading operation can be performed.

Figure 6C:
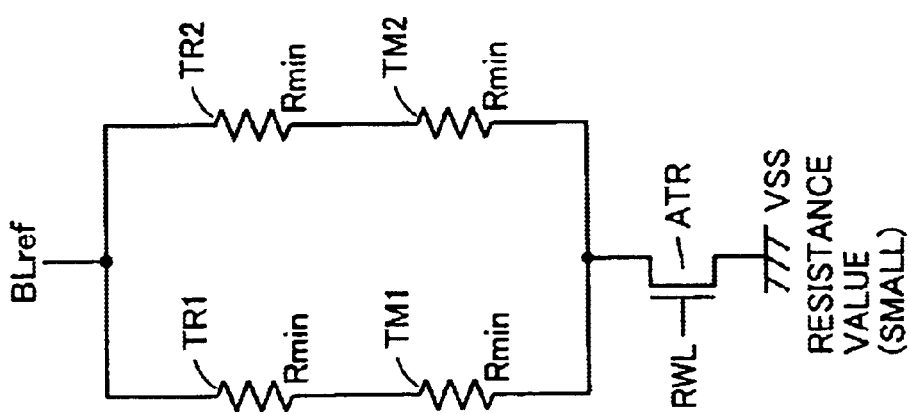
FIGS. 6A, 6B and 6C show variations of the dummy cell according to the first embodiment of the present invention.
Figure 6B:
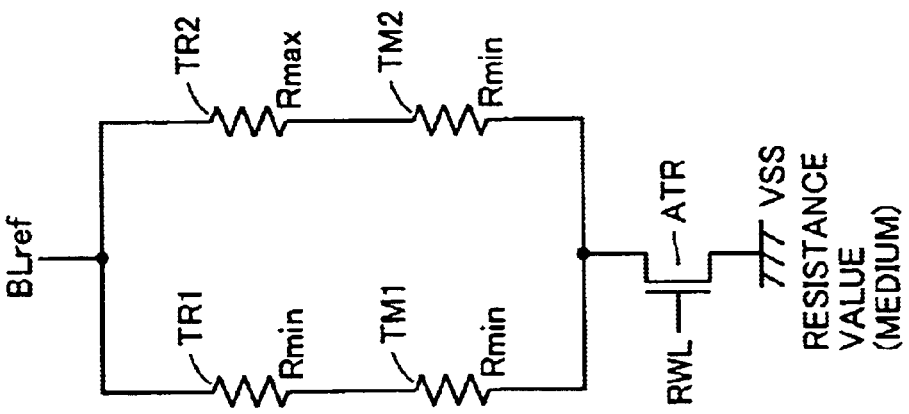
Figure 6A:
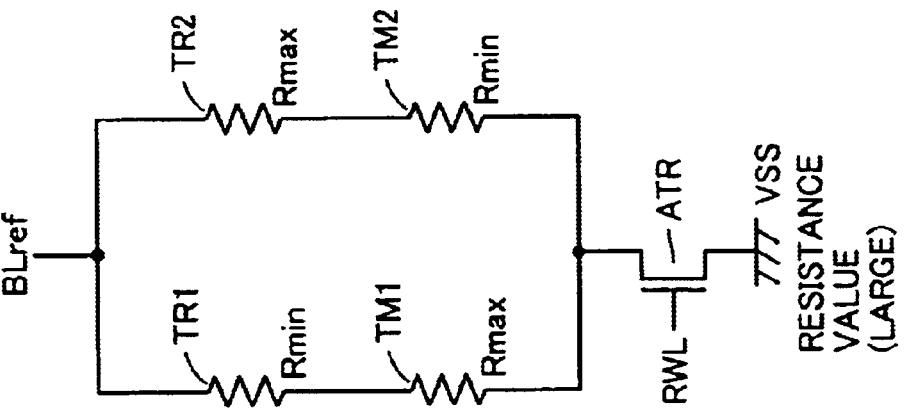

FIG. 6A shows the same dummy cell as shown in FIG. 4. Though tunneling magneto-resistance elements, all of which have the characteristic of electric resistance value Rmin, are arranged in the dummy cell shown in FIG. 4, herein at least one of the tunneling magneto-resistance elements is changed to a tunneling magneto-resistance element having the characteristic of electric resistance value Rmax. Referring to FIG. 6B, tunneling magneto-resistance element TR2 is changed to have the characteristic of electric resistance value Rmax. With this, the combined resistance value will become higher than that of the dummy cell shown in FIG. 6A. Referring to FIG. 6C, tunneling magneto-resistance element TM1 is additionally changed to have the characteristic of electric resistance value Rmax. With this, the combined resistance value will become higher than that of the dummy cell shown in FIG. 6B.

According to these structures, the combined resistance value Rda of the dummy cell can be increased and tuned by changing at least one of four tunneling magneto-resistance elements to have the characteristic of electric resistance value Rmax.

Referring to FIGS. 7A–7C, a transistor GT is further provided to each of the dummy cells shown in FIGS. 6A–6C. Transistor GT is arranged between a connection node NA of tunneling magneto-resistance elements TR1 and TM1 and a connection node NB of tunneling magneto-resistance elements TR2 and TM2, and the gate thereof receives an input of a control signal Ctr.

Connection nodes NA and NB are electrically coupled by the input of control signal Ctr. That is, nodes NA and NB are set to the same voltage level. With this, tunneling magneto-resistance elements TR1 and TR2 are connected in parallel. The other tunneling magneto-resistance elements TM1 and TM2 are also connected in parallel, and these sets of parallel tunneling magneto-resistance elements are connected in series.

In the structure of the dummy cell shown in FIG. 7A, the combined resistance will not change if control signal Ctr is input. In the structure of the dummy cell shown in FIG. 7B, the combined resistance will change when control signal Ctr is input, and the combined resistance value set in FIG. 6B can further be adjusted. Similarly, in the structure of the dummy cell shown in FIG. 7C, the combined resistance will change when control signal Ctr is input, and the combined resistance value set in FIG. 6C can further be adjusted.

As in these structures, combined resistance value Rda of the dummy cell can further be tuned by inputting control signal Ctr and electrically coupling connection nodes NA and NB to change the combined resistance.

(Modification of the First Embodiment)

A modification of the first embodiment of the present invention involves a structure which can adapt to variations in resistance characteristics which occur in manufacturing of dummy cells.

Figure 8:
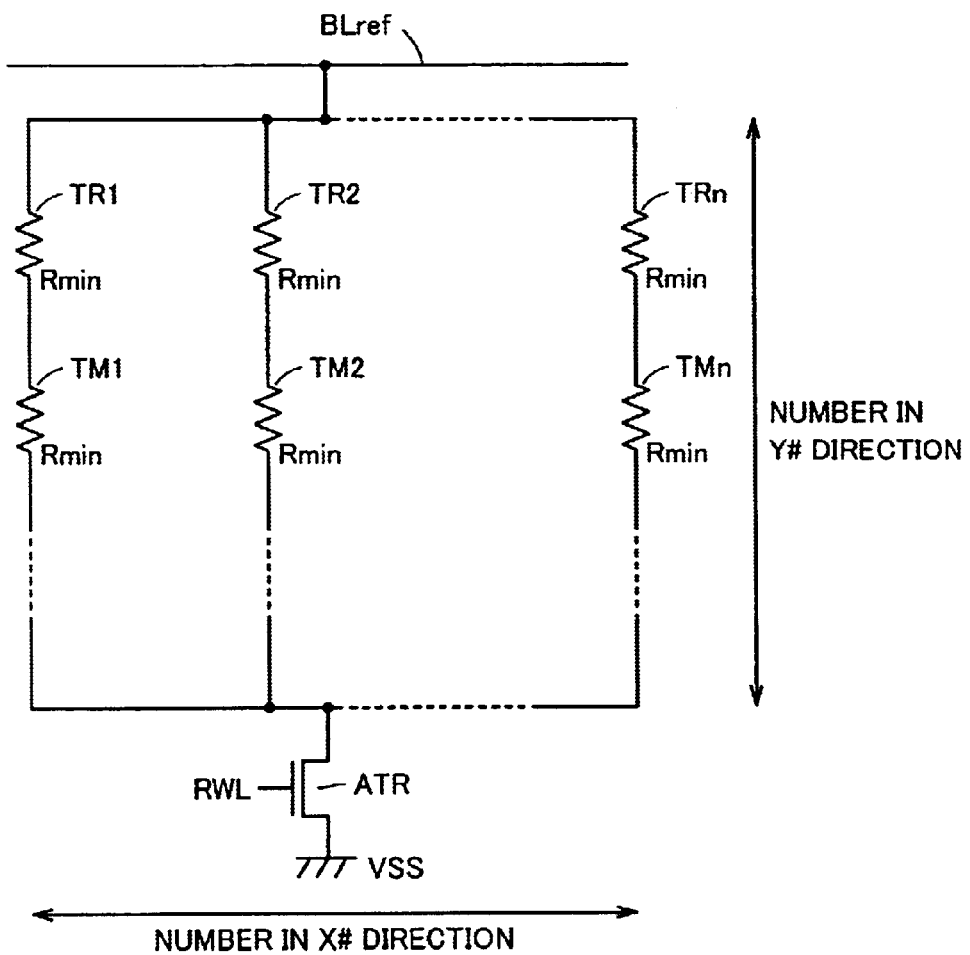
FIG. 8 shows a structure of a dummy cell according to a modification of the first embodiment of the present invention.

Referring to FIG. 8, a dummy cell according to the modification of the first embodiment of the present invention has a structure such that, n tunneling magneto-resistance elements, each having a characteristic of electric resistance value Rmin, are connected in series in a Y# direction, while n sets of the n serial tunneling magneto-resistance elements are provided in parallel in a X# direction.

Combined resistance Rda of the dummy cell having this structure corresponds to a resistance value of one tunneling magneto-resistance element having the characteristic of electric resistance value Rmin. Thus, 1/n of bias voltage Vdata is applied to each tunneling magneto-resistance element.

As an example, a situation will be described wherein voltage dependency of a tunneling magneto-resistance element having the characteristic of electric resistance value Rmin is low, that is, the rate of change (gradient) thereof is small as a characteristic of an electric resistance value Rmin# shown in FIG. 5, due to variation in manufacturing.

By setting n=3 in this situation, for example, combined resistance Rda of the dummy cell can be set to the resistance value of one tunneling magneto-resistance element corresponding to ⅓ of bias voltage Vdata. When the tunneling magneto-resistance elements have the characteristic of electric resistance value Rmin# shown in FIG. 5, combined resistance value Rda can be set to an approximate value to an ideal intermediate resistance value by setting n=3.

Thus, by adjusting the number n of tunneling magneto-resistance elements having the characteristic of electric resistance value Rmin, the bias voltage applied to each tunneling magneto-resistance element can be adjusted, and combined resistance value Rda can be set to an approximate value to an ideal intermediate resistance value.

Therefore, it becomes possible to adjust the combined resistance value of the dummy cell corresponding to the variations in resistance characteristics in manufacturing, and to ensure the sufficient difference in resistances, that is, the difference in passing currents in the dummy cell and the selected memory cell, to perform the high-speed and stable data reading operation.

(Second Embodiment)

A second embodiment of the present invention involves a structure of a dummy cell wherein an intermediate resistance value is set in a way different from that in the dummy cell of the first embodiment.

Figure 9:
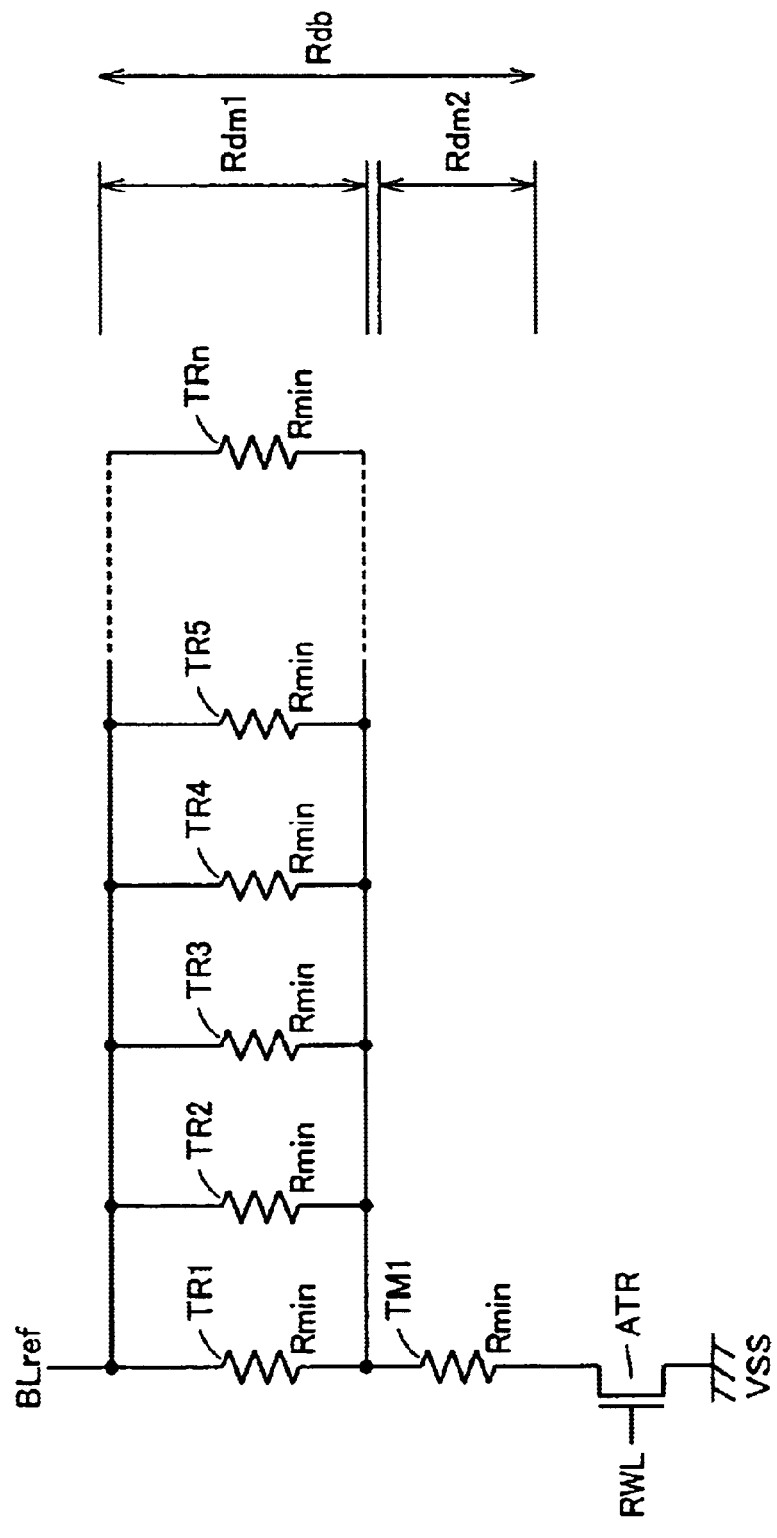
FIG. 9 shows a structure of a dummy cell according to a second embodiment of the present invention.

Referring to FIG. 9, the dummy cell according to the second embodiment of the present invention includes tunneling magneto-resistance element TM1, tunneling magneto-resistance elements TR1–TRn and access transistor ATR. Tunneling magneto-resistance elements TR1–TRn and TM1 have the characteristic of electric resistance value Rmin of an initial state.

Tunneling magneto-resistance elements TR1–TRn are connected to each other in parallel. These parallel tunneling magneto-resistance elements TR1–TRn and tunneling magneto-resistance element TM1 are connected in series.

Herein, a combined resistance Rdb of the dummy cell according to the second embodiment of the present invention is set to sum of a combined resistance Rdm1 of tunneling magneto-resistance elements TR1–TRn and a resistance value Rdm2 of tunneling magneto-resistance element TM1. Combined resistance Rdm1 corresponds to 1/n of electric resistance value Rmin of one tunneling magneto-resistance element.

When bias voltage Vdata is applied to the selected memory cell on data reading, voltages divided in proportion to a resistance ratio of combined resistances Rdm1 and Rdm2 are respectively applied to each of the parallel tunneling magneto-resistance elements TR1–TRn and tunneling magneto-resistance element TM1.

When n=1, that is, when the structure has tunneling magneto-resistance elements TR1 and TM1 connected in series, a half of bias voltage Vdata is applied to each tunneling magneto-resistance element. Combined resistance Rdb corresponds to sum of resistances Rdm1 and Rdm2, and is set to a double value of the resistance value corresponding to the voltage of Vdata/2, referring to FIG. 5.

On the other hand, when n=∞, combined resistance Rdm becomes zero (=Rmin/n). Therefore, combined resistance Rdb corresponds to resistance Rdm2. Accordingly, the voltage corresponding to bias voltage Vdata is applied to tunneling magneto-resistance element TM1. Combined resistance Rdb corresponds to a resistance value when bias voltage Vdata is applied to one tunneling magneto-resistance element having a characteristic of electric resistance value Rmin, referring to FIG. 5.

Thus, by adjusting the number of tunneling magneto-resistance elements provided in parallel, combined resistance Rdb can be set to a value ranging from a double value of the electric resistance value where the voltage of Vdata/2 is applied to one tunneling magneto-resistance element, to an electric resistance value where bias voltage Vdata is applied.

That means, by setting the number of tunneling magneto-resistance elements TR1–TRn connected in parallel to a prescribed number, combined resistance value Rdb can be set to an ideal intermediate resistance value between electric resistance values Rmax and Rmin obtained when bias voltage Vdata is applied to the selected memory cell.

Accordingly, the intermediate resistance value of the dummy cell having voltage dependency can be tuned with high accuracy. Therefore, it is possible to ensure the sufficient difference in resistances, that is, the difference in passing currents between the dummy cell and the selected memory cell, and the high-speed and stable data reading operation can be performed.

(Modification of the Second Embodiment)

Though the structure is described in the second embodiment wherein combined resistance Rdb of the dummy cell is set to an ideal intermediate resistance value by setting the number of tunneling magneto-resistance elements connected in parallel to a prescribed number, the characteristics of aforementioned electric resistance values Rmax and Rmin vary in manufacturing.

Figure 10:
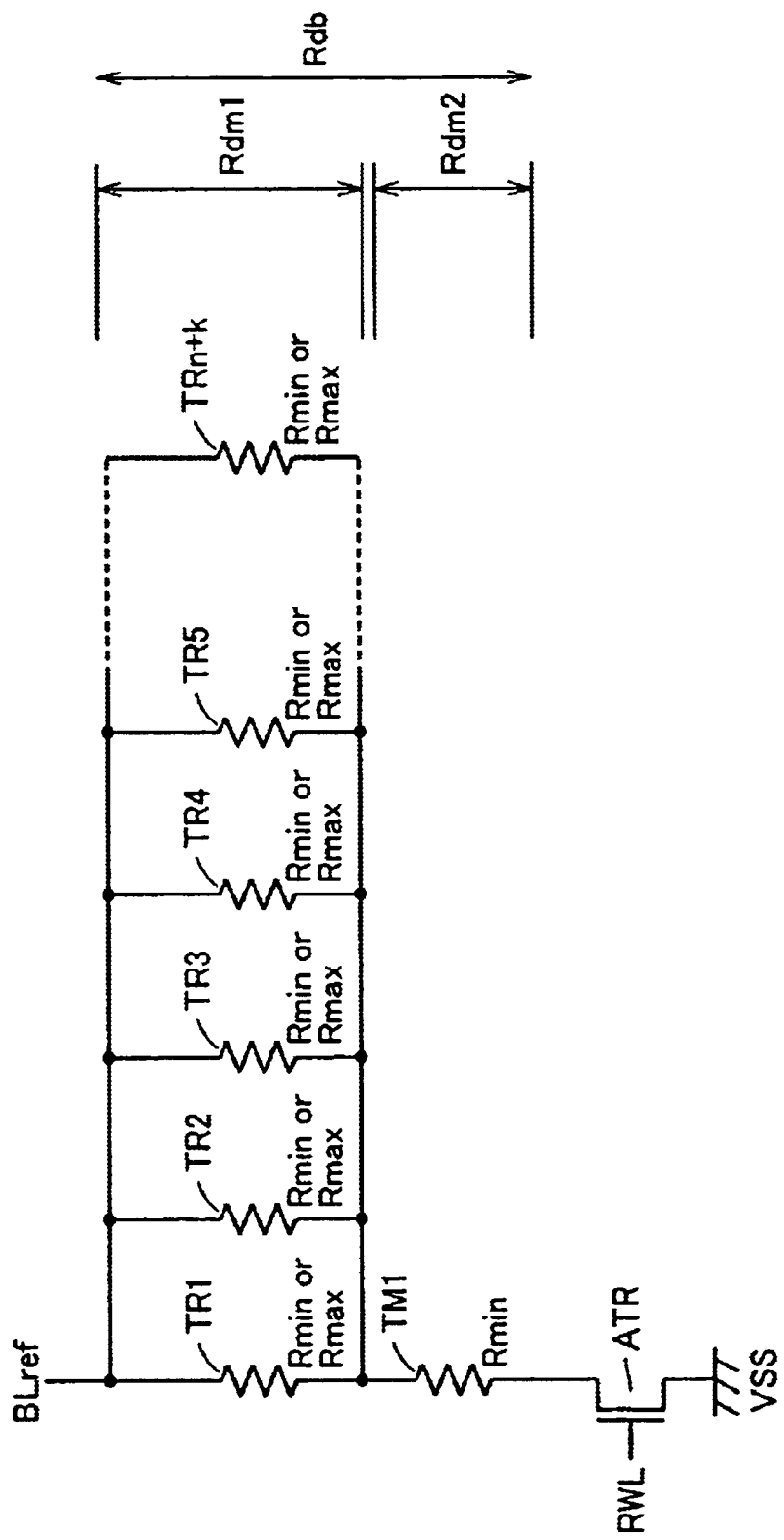
FIG. 10 shows a structure of a dummy cell according to a modification of the second embodiment.

Referring to FIG. 10, a dummy cell according to a modification of the second embodiment has a structure wherein k (k: natural number) tunneling magneto-resistance elements are further connected parallel to the n tunneling magneto-resistance elements shown in FIG. 9.

With such a structure, combined resistance value Rdb of the dummy cell can be set beforehand to a lower value than a desired ideal intermediate resistance value in a designing step.

Thus, combined resistance value Rdb in the designing step can finely be tuned by changing at least one tunneling magneto-resistance element having the characteristic of electric resistance value Rmin of an initial state to a tunneling magneto-resistance element having the characteristic of electric resistance value Rmax.

Therefore, by setting combined resistance value Rdb to a lower value beforehand, the structure can adapt to the variation in manufacturing and, at the same time, the intermediate resistance value of the dummy cell which has voltage dependency larger than that in the second embodiment can be tuned with high accuracy. With this, the sufficient difference in resistances, that is, the difference in passing currents between the dummy cell and the selected memory cell can be ensured, and the high-speed and stable data reading operation can be performed.

(Third Embodiment)

Figure 11:
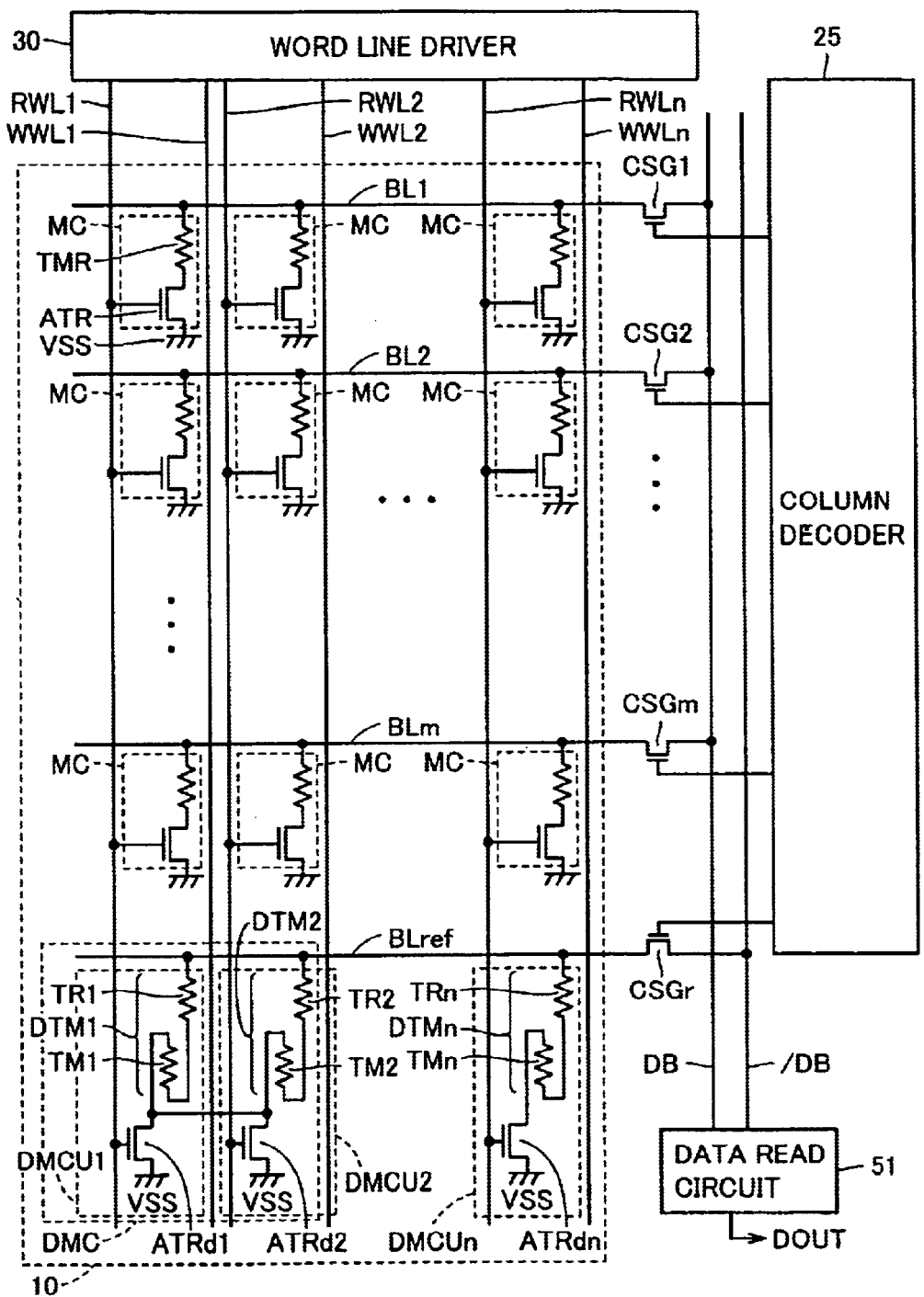
FIG. 11 is a layout showing a situation when the dummy cell described in the first embodiment is arranged in a memory array.

A memory array according to a third embodiment of the present invention as shown in FIG. 11 differs from that shown in FIG. 2 in that, a dummy cell unit DMCU in place of the dummy cell is provided corresponding to reference bit line BLref and each memory cell row. As it has the same structure except for that point, detailed description thereof will not be repeated.

Dummy cell units DMCU1, DMCU2 and DMCUn (which are also collectively referred to as dummy cell unit DMCU hereafter) are provided corresponding to reference bit line BLref and read word lines RWL1, RWL2 , and RWLn, respectively.

Dummy cell unit DMCU1 includes tunneling magneto-resistance elements TR1, TM1 and an access transistor ATRd1. Dummy cell unit DMCU1 includes a magneto-resistance portion DTM1 formed with tunneling magneto-resistance elements TR1 and TM1 connected in series. Magneto-resistance portion DTM1 and access transistor ATRd1 are arranged in series between reference bit line BLref and ground voltage VSS. The gate of access transistor ATRd1 is electrically connected to the corresponding read word line RWL1. In addition, dummy cell unit DMCU2 includes a magneto-resistance portion DTM2 formed with tunneling magneto-resistance elements TR2 and TM2 connected in series. Magneto-resistance portion DTM2 and an access transistor ATRd2 are arranged in series between reference bit line BLref and the ground voltage. The gate of access transistor ATRd2 is electrically coupled to the corresponding read word line RWL2. As the other dummy cell units have the same structure, detailed description thereof will not be repeated.

In the following, tunneling magneto-resistance elements TR1–TRn, TM1–TMn are also collectively referred to as tunneling magneto-resistance elements TR and TM, respectively. Magneto-resistance portions DTM1–DTMn are also collectively referred to as a magneto-resistance portion DTM.

Herein, two adjacent memory cell rows are made as a set, for example, and two magneto-resistance portions DTMs of the corresponding dummy cell units DMCUs are electrically coupled in parallel. In FIG. 11, memory cell rows respectively corresponding to read word lines RWL1, RWL2 are made as a set, and magneto-resistance portions DTM1, DTM2 respectively included in the corresponding dummy cell units DMCU1, DMCU2 are electrically coupled in parallel. Therefore, dummy cell units DMCUs share the adjacent magneto-resistance portions with each other. With this structure of sharing the adjacent magneto-resistance portions with each other, dummy cell DMC as shown in FIG. 4 can efficiently and easily be provided to each memory cell row.

In the foregoing example, the structure has been described wherein a plurality of dummy cell units DMCUs are arranged along the column direction so as to enable sharing of the memory cell row, and wherein every two dummy cell units DMCUs are made as a group and the magneto-resistance portions belonging to each group are electrically coupled to form a dummy cell. The group, however, is not limited to include two dummy cell units DMCUs, and the structure is also applicable to form a dummy cell with a prescribed plural number provided as a group.

Consequently, a layout area of dummy cell DMC can be made smaller.

(Modification of the Third Embodiment)

Figure 12:
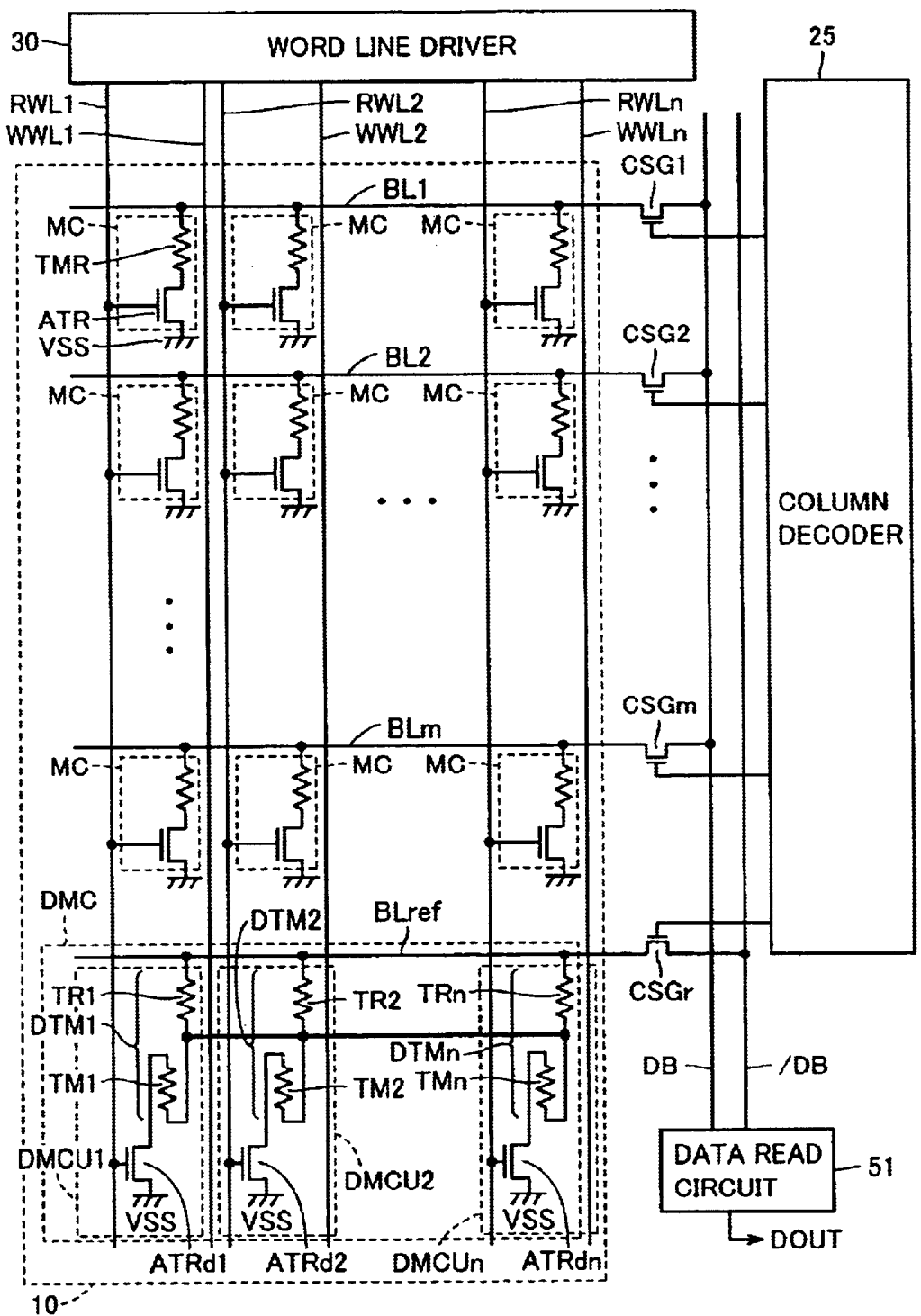
FIG. 12 is a layout showing a situation when the dummy cell described in the second embodiment is arranged in a memory array.

A memory array according to a modification of the third embodiment of the present invention as shown in FIG. 12 differs from that shown in FIG. 11 in that, n adjacent memory cell rows are made as a group, and a part of respective magneto-resistance portions DTMs of the corresponding n dummy cell units DMCUs are electrically coupled. As it has the same structure except for that point, detailed description thereof will not be repeated.

In FIG. 12, n memory cell rows respectively corresponding to read word lines RWL1, RWL2–RWLn are made as a group, and dummy cell units DMCU1, DMCU2–DMCUn are respectively provided so as to share the memory cell rows. In each of magneto-resistance portions DTM1, DTM2–DTMn respectively included in dummy cell units DMCU1, DMCU2–DMCUn, a connection node between tunneling magneto-resistance elements TR and TM is electrically coupled to the connection node of adjacent magneto-resistance portion DTM. That is, adjacent tunneling magneto-resistance elements TRs of n magneto-resistance portions DTMs forming dummy memory cell units DMCUs belonging to the same group are shared with each other.

With this structure of sharing adjacent tunneling magneto-resistance elements TRs of n magneto-resistance portions DTMs with each other, dummy cell DMC described with reference to FIG. 9 can efficiently and easily be provided to each memory cell row. Consequently, the layout area of dummy cell DMC can be made smaller.

Though the number of tunneling magneto-resistance elements TRs in dummy cell DMC is set to n in this modification of the third embodiment, the number can be set arbitrarily according to the voltage dependency of combined resistance Rdb of the tunneling magneto-resistance elements, as described in the second embodiment.

(Fourth Embodiment)

In the modification of the third embodiment, the structure is described wherein the layout of the dummy cell as described in FIG. 4 is efficiently and easily implemented as a part of the magneto-resistance portions of n adjacent dummy cell units DMCUs is shared.

In a fourth embodiment, a layout structure of the memory array will be described wherein the number of dummy cell units provided corresponding to memory cell rows does not match with the desired number of dummy cell units shared to form the dummy cell.

Description will be provided for a situation when, for example, 256 memory cell rows are provided beforehand in a memory array, and the dummy cell is formed with making five (n=5) adjacent dummy cell units DMCUs, which are arranged to share the memory cell row, as a group.

Figure 13:
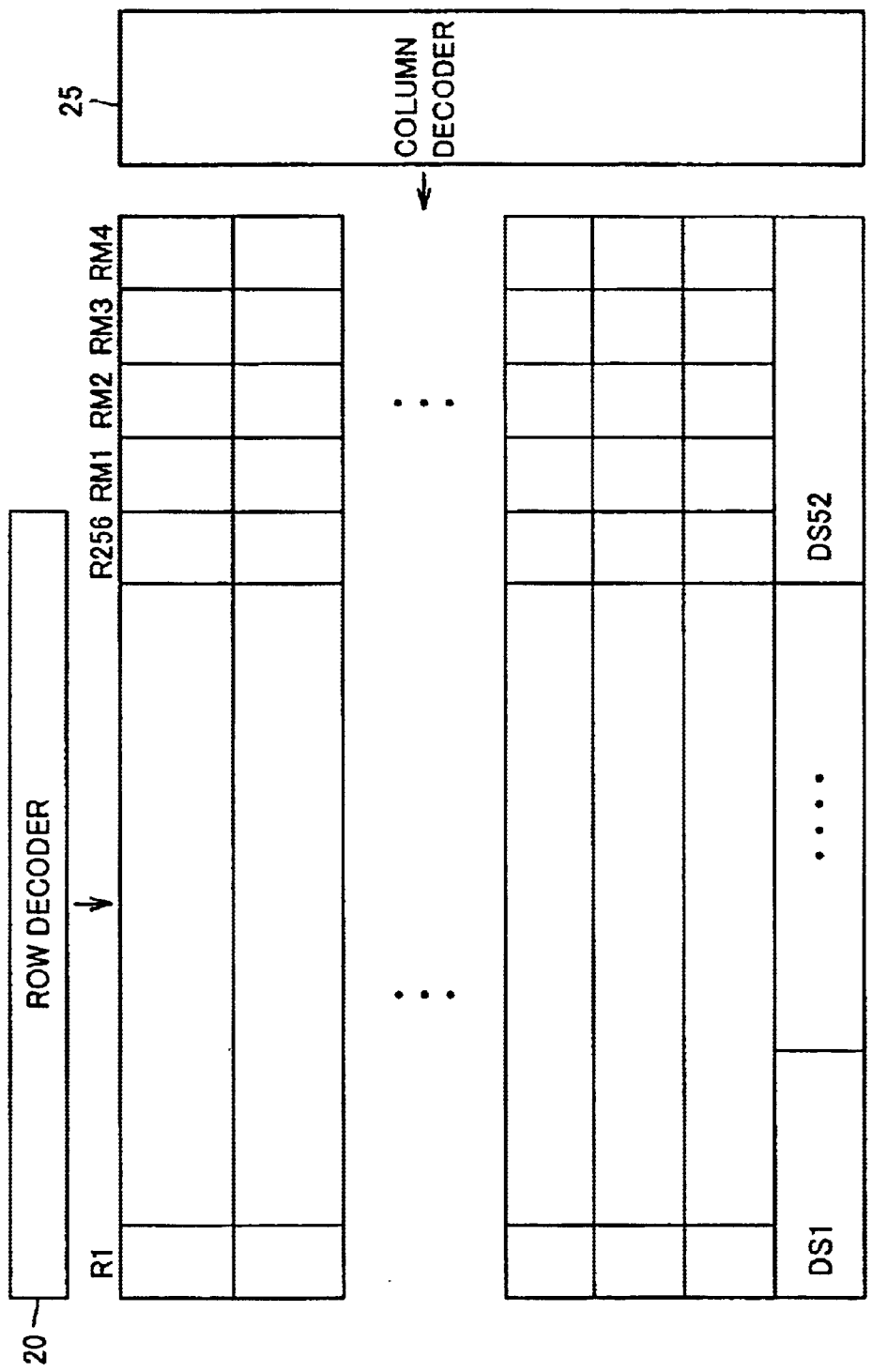
FIG. 13 is a schematic block diagram of a dummy cell in a structure wherein memory cell rows are provided beforehand to a memory cell array.

FIG. 13 is a schematic block diagram of a formation of the dummy cell with making five dummy cell units as a group in a structure wherein memory cell rows R1–R256 are provided beforehand to the memory array.

Referring to FIG. 13, five dummy cell units DMCUs forming a dummy cell DS1 are arranged corresponding to memory cell rows R1–R5. When dummy cell units DMCUs are correspondingly arranged in a similar manner, four of five dummy cell units forming a dummy cell DS52, except for one dummy cell unit which corresponds to memory cell row R256, cannot be arranged corresponding to memory cell rows.

In the structure of the fourth embodiment, redundant memory cell rows are provided beforehand corresponding to the desired number of dummy cell units to form a group.

Referring to FIG. 13, redundant memory cell rows RM1–RM4 are respectively provided corresponding to the remaining four dummy cell units forming dummy cell DS52.

Specifically, redundant memory cell rows are provided in a number which corresponds to the remainder of the division P/Q, where P represents the number of pre-set memory cell rows and Q represents the number of shared dummy cell units.

The area of memory array can effectively be utilized by providing redundant memory cell rows corresponding to the remainder of dummy cell units. In addition, manufacturing process of the memory array can be simplified because the memory cell rows forming the memory array are formed with a continuous repetitive unit.

(Fifth Embodiment)

Figure 14:
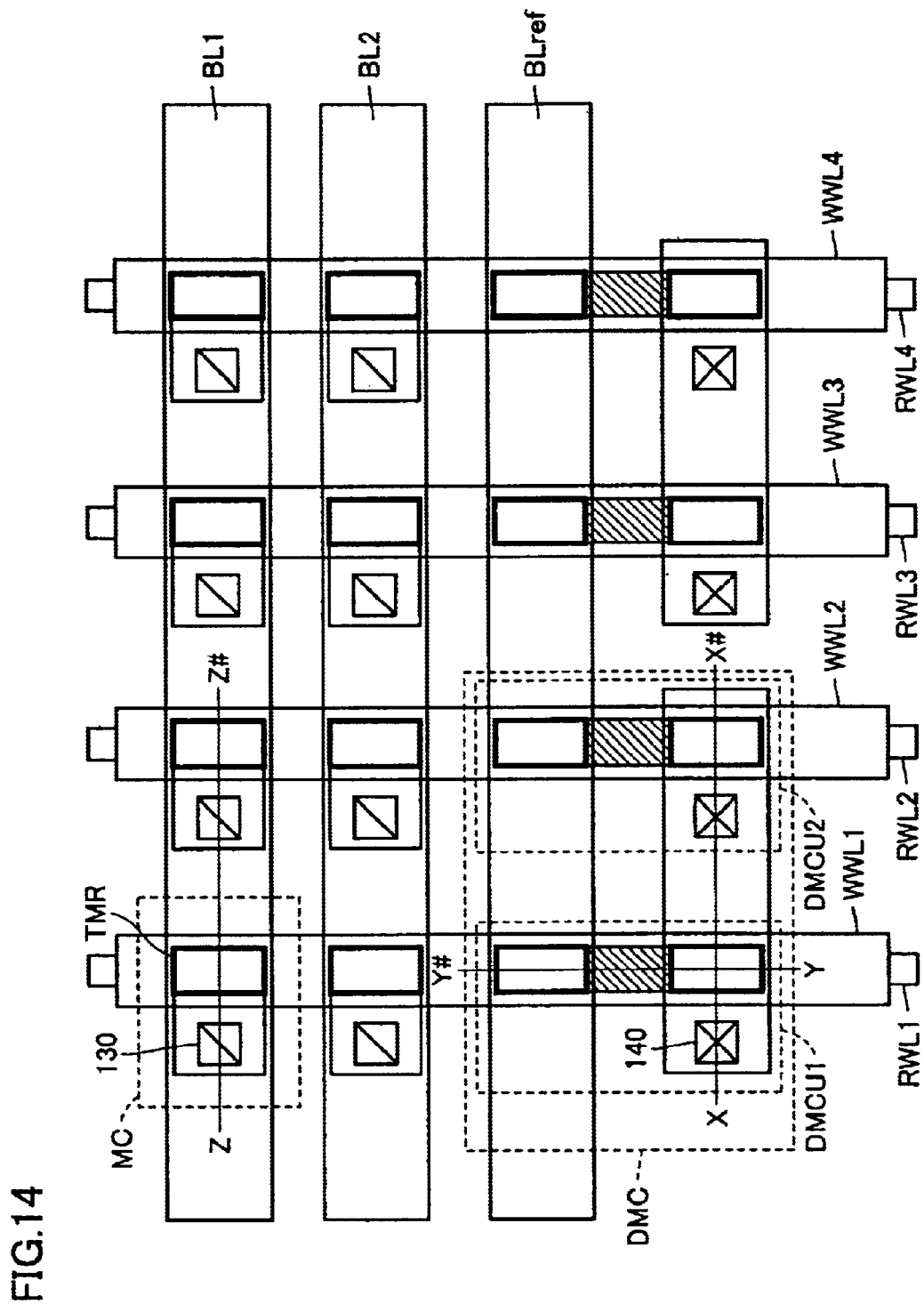
FIG. 14 is a schematic diagram showing a first arrangement example of MTJ memory cells according to a fifth embodiment of the present invention.

Memory cells MCs and dummy cells DMCs according to a fifth embodiment of the present invention, which correspond to the first row of first column through the fourth row of second column, are shown in FIG. 14. Read word lines RWL1–RWL4, write word lines WWL1–WWL4, bit lines BL1, BL2, and reference bit line BLref corresponding to these memory cells and dummy cells are representatively shown herein.

In each memory cell MC, one end of tunneling magneto-resistance element TMR is electrically coupled to bit line BL, while the other end is electrically coupled to a transistor of a lower layer via a contact 130.

Figure 15:
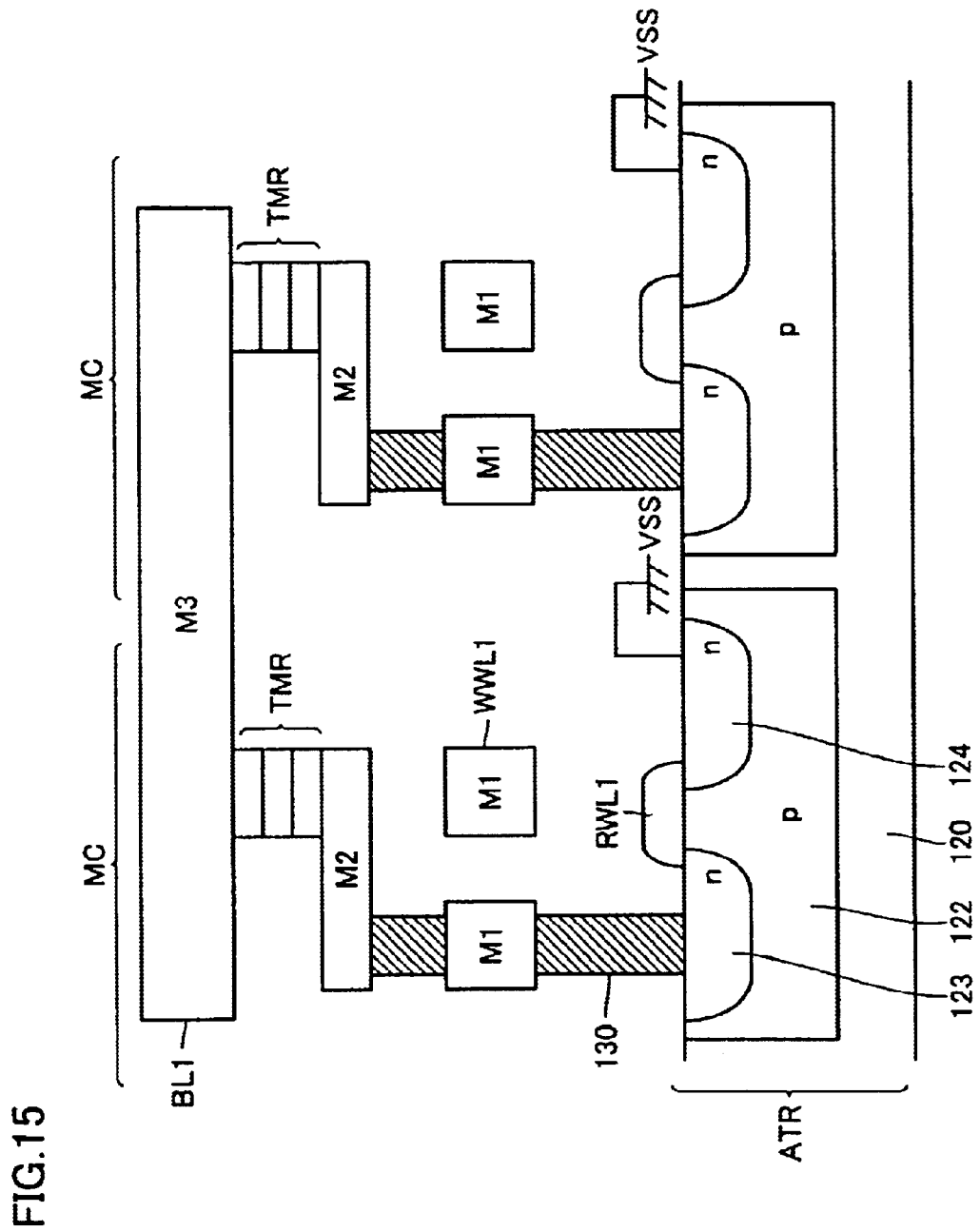
FIG. 15 is a cross-sectional view of a memory cell MC.

Referring to FIG. 15 which is a cross-sectional view taken along the line Z-Z# of memory cell MC, access transistor ATR is formed in a P type region 122 on a semiconductor substrate 120. Access transistor ATR has N type source/drain regions 123, 124, and a gate region electrically couples with read word line RWL1. Drain region 124 supplies ground voltage VSS to form a sense current (data read current) path during data reading. Metal wiring formed in a first metal wiring layer M1 is used as write word line WWL1. Metal wiring formed in a third metal wiring layer M3 is used as bit line BL1. Tunneling magneto-resistance element TMR is arranged between third metal wiring layer M3 which is bit line BL1 and a second metal wiring layer M2. Contact 130 electrically couples drain region 123 and second metal wiring layer M2 via first metal wiring layer M1.

A layout of dummy cell DMC will now be described.

Referring back to FIG. 14, dummy cell DMC includes dummy cell units DMCU1 and DMCU2.

Figure 16:
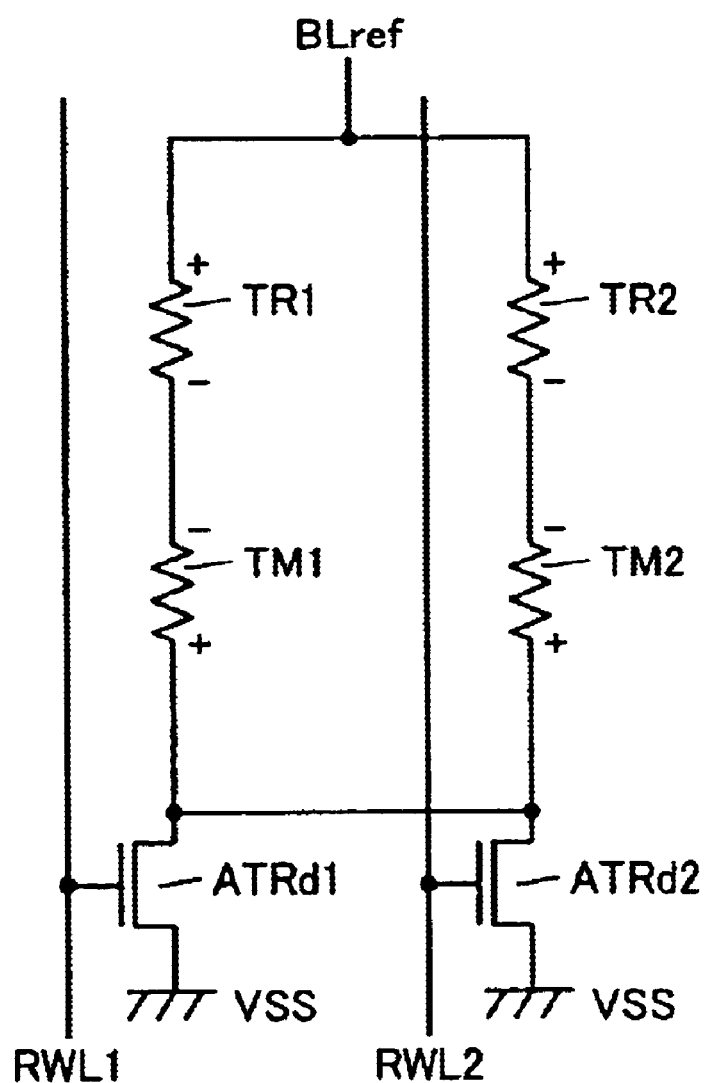
FIG. 16 is a model diagram of a dummy cell shown in FIG. 14.

Though dummy cell DMC shown in FIG. 16 has a similar structure of the dummy cell described in the fourth embodiment with reference to FIG. 10, herein, tunneling magneto-resistance elements TR1 and TM1 are electrically connected in series with electrodes of the same polarity. More specifically, negative electrode of one element is coupled to negative electrode of the other element.

Figure 17:
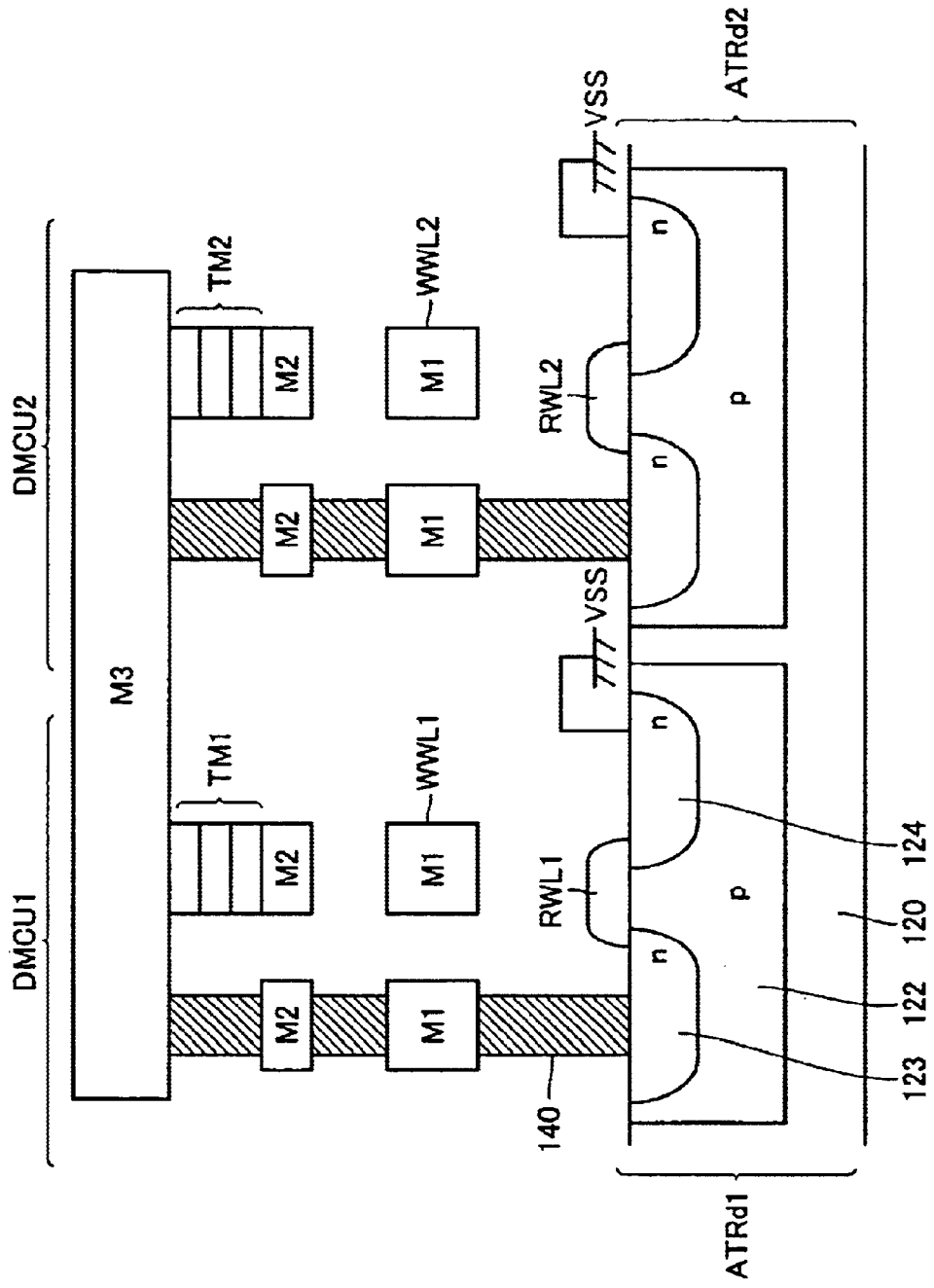
FIGS. 17 and 18 are cross-sectional views of the dummy cell.

Referring to FIG. 17 which is a cross-sectional view taken along the line X-X# of dummy cell DMC shown in FIG. 14, access transistor ATRd1 is formed in P type region 122 on semiconductor substrate 120, as described with reference to FIG. 15. Access transistor ATRd1 electrically couples drain region 123 to third metal wiring layer M3 with a contact 140 connected via first and second metal wiring layers M1 and M2. Tunneling magneto-resistance element TM1 is arranged between third and second metal wiring layers M3 and M2. With this third metal wiring layer M3, adjacent dummy cell units DMCU1 and DMCU2 are electrically coupled.

Figure 18:
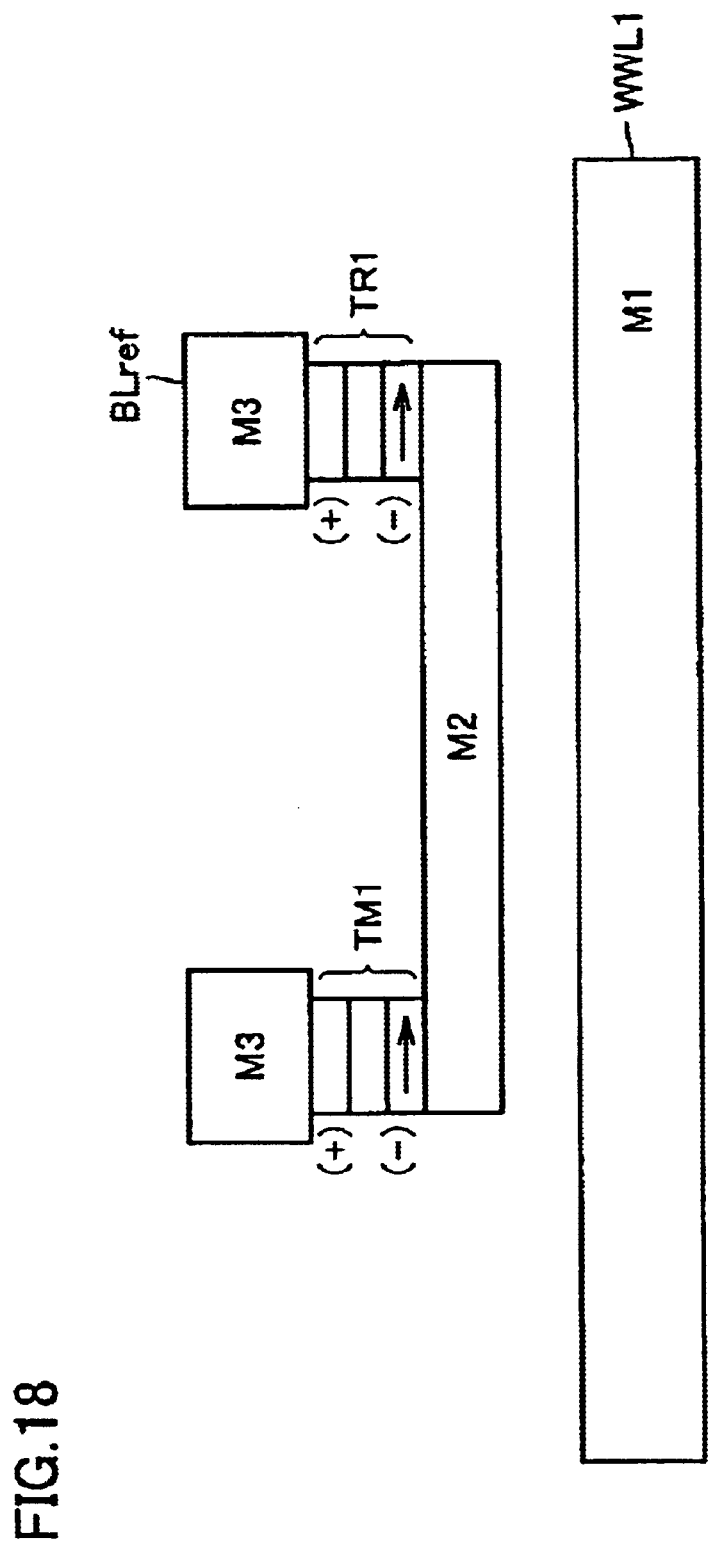

As shown in FIG. 18 which is a cross-sectional view taken along the line Y-Y# of dummy cell DMC shown in FIG. 14, tunneling magneto-resistance elements TM1 and TR1 are electrically coupled with each other, both at the negative electrodes, via second metal wiring layer M2.

In addition, reference bit line BLref is formed on third metal wiring layer M3 which is connected to tunneling magneto-resistance element TR1. Write word line WWL1 is arranged in first metal wiring layer M1 formed below second metal wiring layer M2, while read word line RWL1 which is connected to a gate of a transistor is arranged in a layer further therebelow.

Figure 19:
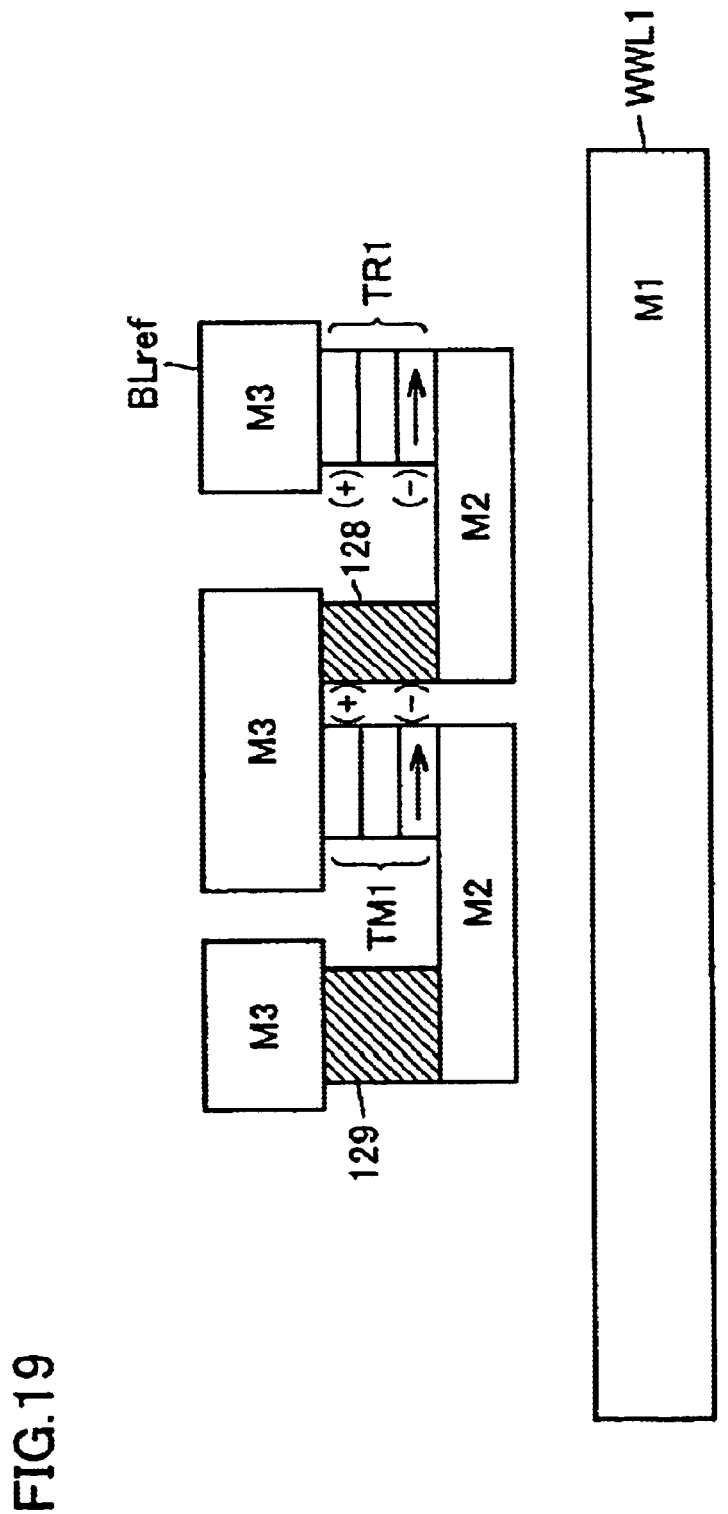
FIG. 19 is a cross-sectional view showing a situation when fixed magnetic layers magnetized in the same direction are electrically coupled in a connective relation between tunneling magneto-resistance elements.

When one and the other of the positive and negative electrodes of respective tunneling magneto-resistance elements TM1 and TR1 are electrically coupled, it is necessary to electrically couple second metal wiring layer M2 and third metal wiring layer M3 via a contact 128, and to arrange tunneling magneto-resistance element TM1 between third metal wiring layer M3 and second metal wiring layer M2, as shown in FIG. 19. Further, second metal wiring layer M2 and third metal wiring layer M3 are electrically coupled via a contact hole 129. Thus, in this example, contacts 128 and 129 must additionally be provided to connect with the third metal wiring layer.

Therefore, a dummy cell unit can easily be designed without providing an unnecessary contact hole by the layout of this embodiment described with reference to FIG. 18, in contrast with the structure shown in FIG. 19. Accordingly, dummy cell DMC can easily be designed.

(Modification of the Fifth Embodiment)

Figure 20:
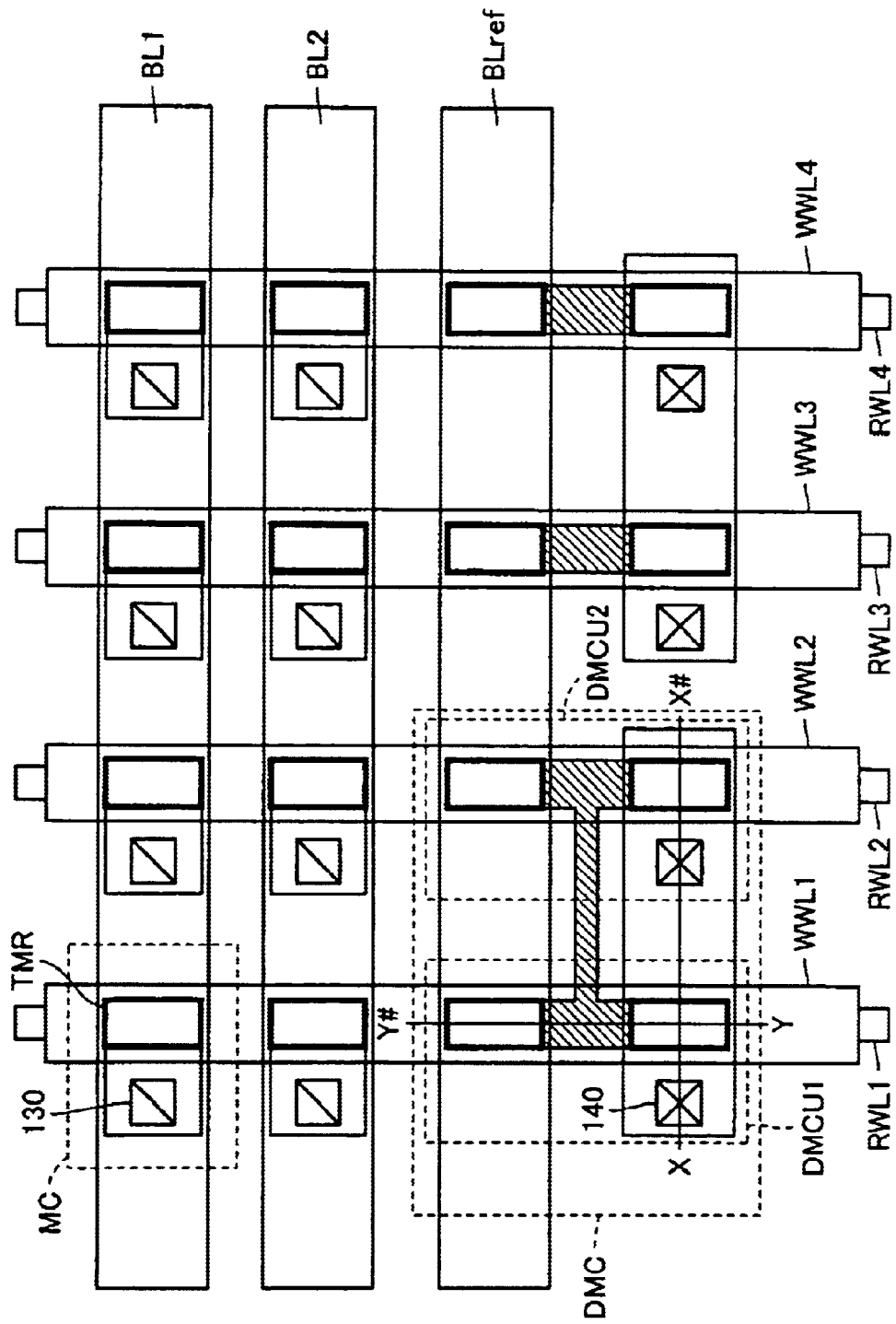
FIG. 20 shows a layout pattern of a dummy cell according to a modification of the fifth embodiment.

A layout pattern shown in FIG. 20 according to a modification of the fifth embodiment has a different structure of the dummy cell comparing with the layout pattern shown in FIG. 14. As it has the same structure except for that point, detailed description thereof will not be repeated.

Figure 21:
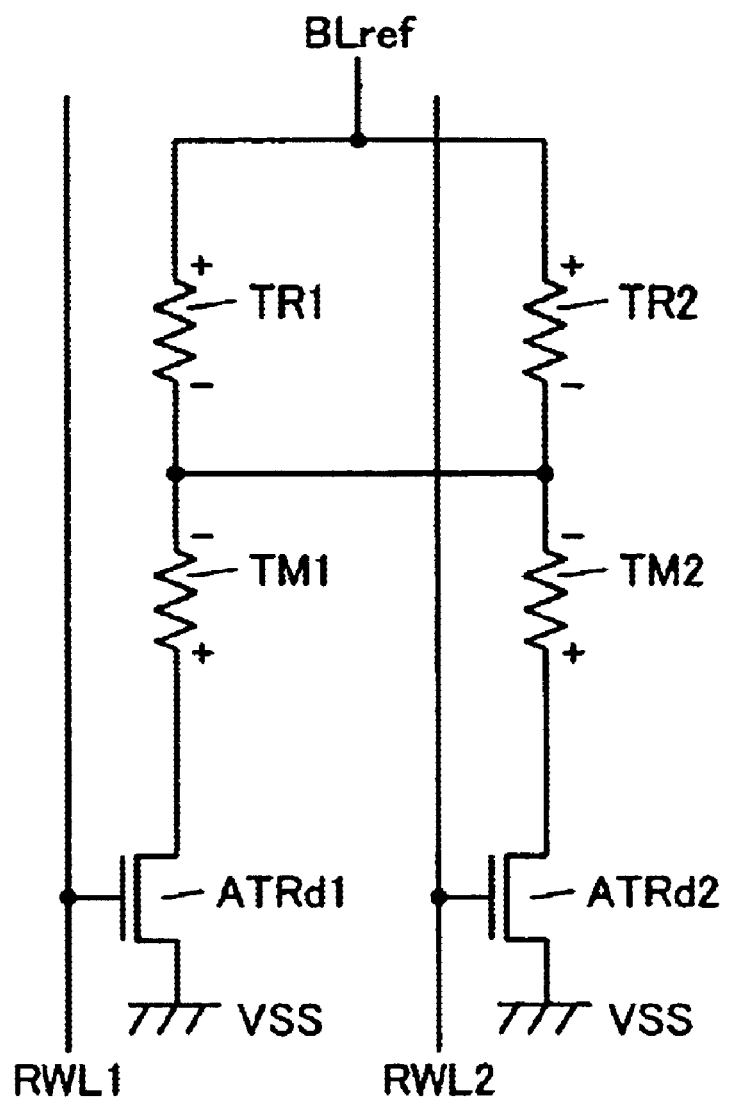
FIG. 21 is a model diagram of the dummy cell described in the modification of the fifth embodiment.

Referring to FIG. 21, a model diagram of the dummy cell according to the modification of the fifth embodiment will be described assuming that the number of shared dummy cell units is n=2. More specifically, a connection node between tunneling magneto-resistance elements TR1 and TM1 and a connection node between tunneling magneto-resistance elements TR2 and TM2 are electrically coupled to each other.

Accordingly, referring back to FIG. 20, dummy cell units DMCU1 and DMCU2 are electrically coupled using the second metal wiring layer shown as a hatched area.

Figure 22:
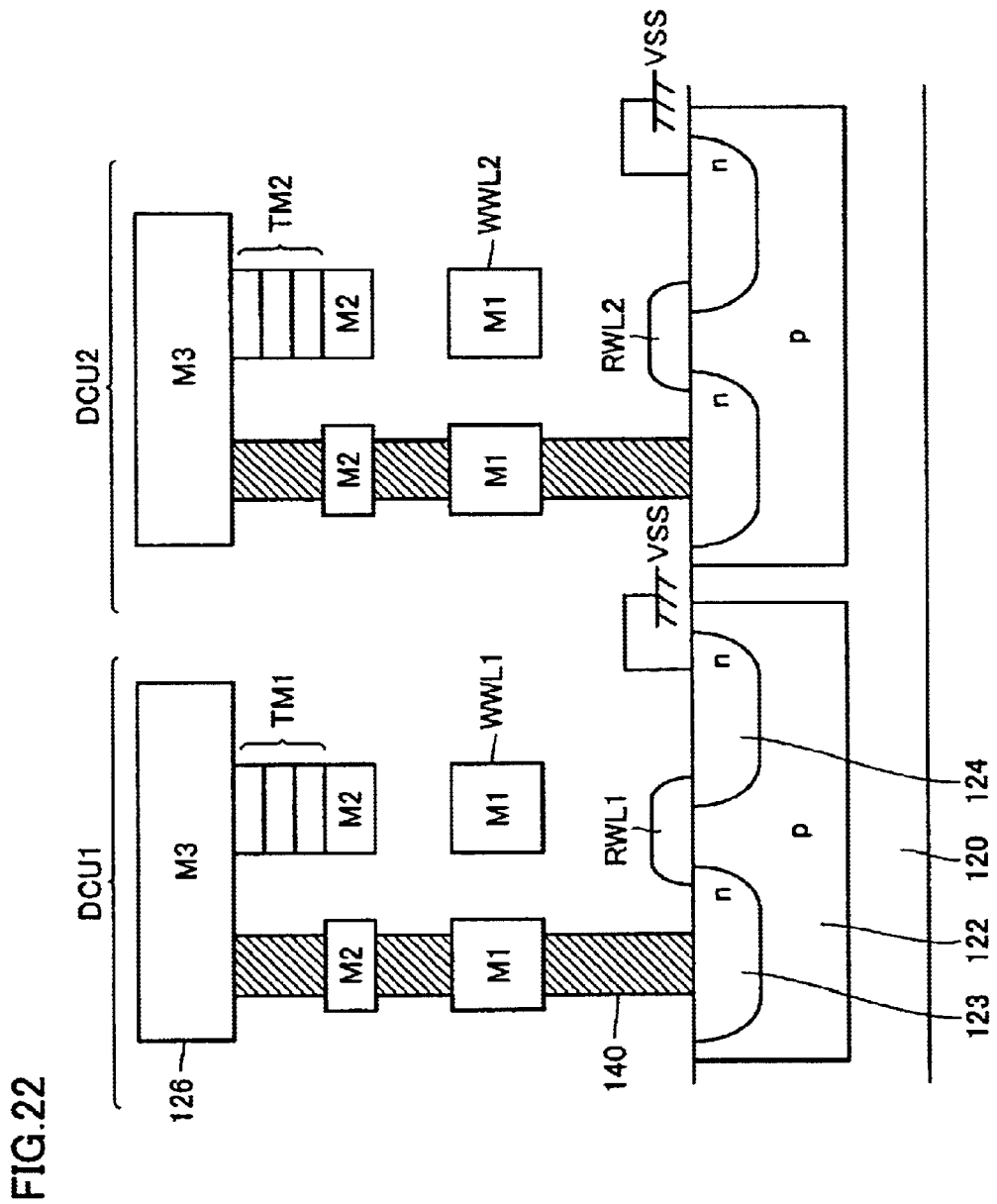
FIG. 22 is a cross-sectional view of a dummy cell DMC.

Referring to FIG. 22 which is a cross-sectional view taken along the line X-X# of dummy cell DMC shown in FIG. 20, third metal wiring layer M3 is electrically separated between tunneling magneto-resistance elements TM1 and TM2, in contrast with the cross-sectional view shown in FIG. 17. Because the other points are the same as that shown in FIG. 17, description thereof will not be repeated. In addition, the cross-sectional view taken along the line Y-Y# is similar to that shown in FIG. 18.

Therefore, the dummy cell unit can also be designed easily in the structure of the dummy cell according to the modification of the fifth embodiment. Consequently, dummy cell DMC can easily be designed.

(Sixth Embodiment)

In the fifth embodiment described above, a layout of the dummy cell unit has been shown. More specifically, a structure has been described wherein the sides of tunneling magneto-resistance elements TR1 and TM1 having the same polarity are electrically connected in series.

The MR ratio obtained when the bias voltage is applied to the tunneling magneto-resistance element in the positive direction may differ in characteristic from that obtained when the bias voltage is applied in the negative direction due to the variations in manufacturing.

Figure 23:
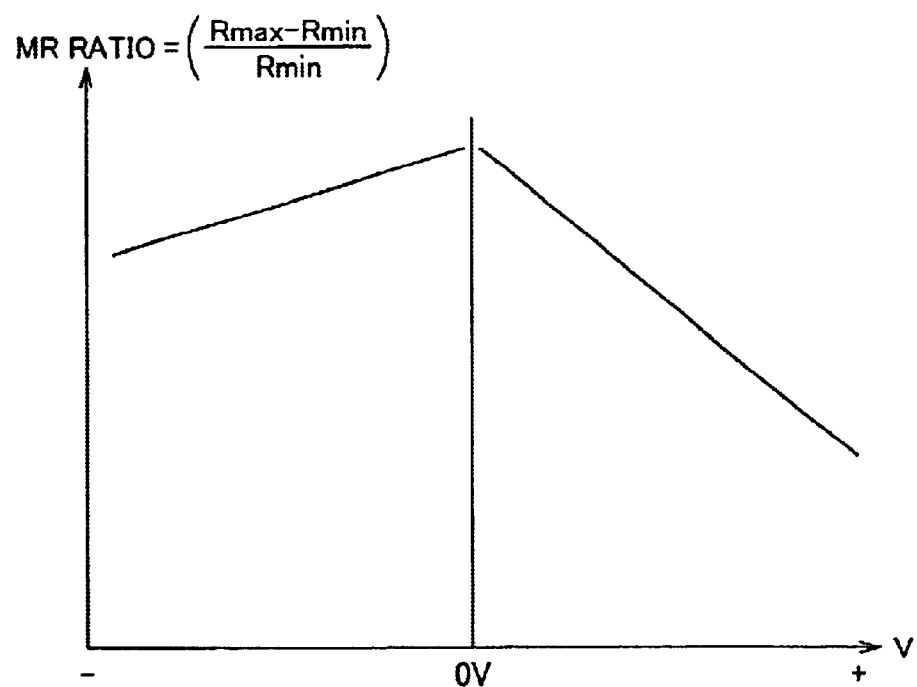
FIG. 23 shows an MR ratio characteristic when bias voltages in positive and negative directions are applied to the tunneling magneto-resistance element.

Referring to FIG. 23, the characteristic of MR ratio corresponding to the bias voltage is asymmetric in the positive and negative directions. MR ratio is represented by (Rmax-Rmin)/Rmin.

In such a case, when the sides of tunneling magneto-resistance elements TR1 and TM1 having the same polarity are electrically coupled in series in the above-described fifth embodiment, one and the other of the positive and negative bias voltages are applied to the respective tunneling magneto-resistance elements. As a result, the resistance values of tunneling magneto-resistance elements TR1 and TM1 make a transition according to different MR ratio characteristics, and the fine adjustment in setting the intermediate resistance value will become very difficult.

Thus, when the MR ratio characteristic is asymmetric in the positive and negative bias voltages, tunneling magneto-resistance elements TR1 and TM1 are connected such that the positive or negative bias voltage is applied to both of them. More specifically, one and the other of positive and negative electrodes of tunneling magneto-resistance elements TR1 and TM1, respectively, are electrically coupled.

Figure 24:
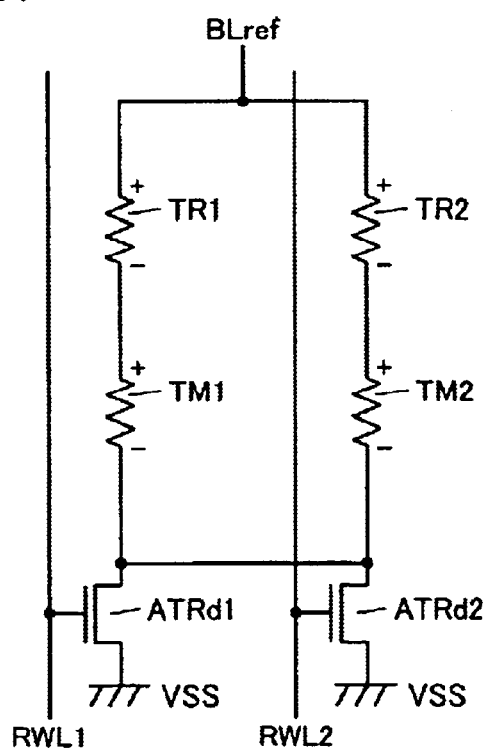
FIG. 24 is a circuit diagram of a dummy cell according to a sixth embodiment of the present invention.

Referring to FIG. 24, with this structure of the dummy cell according to the sixth embodiment of the present invention, the intermediate resistance value can easily be designed because the resistance values of tunneling magneto-resistance elements TR1 and TM1 transit corresponding to the same characteristic of the MR ratio.

When tunneling magneto-resistance elements TR1 and TM1 according to the sixth embodiment are arranged in the layout structure similar to that of the fifth embodiment, cross-sectional view of the structure will be similar to that shown in FIG. 19 taken along the line Y-Y#.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device, comprising:
a plurality of memory cells holding magnetically-written stored data; wherein
each of said memory cells includes a magneto-resistance element having one of a first electric resistance and a second electric resistance larger than said first electric resistance corresponding to said stored data; and
each of said first and second electric resistances has a characteristic which changes corresponding to a voltage applied to opposite ends of said magneto-resistance element;
said thin film magnetic memory device further comprising:
a first data line connected to a first voltage and connected to a second voltage via a selected memory cell among said plurality of memory cells to receive a data read current on data reading;
a dummy cell designed so as to have an intermediate electric resistance between said first and second electric resistances;
a second data line connected to said first voltage and connected to said second voltage via said dummy cell to receive said data read current on said data reading; and
a data read circuit generating read data based on a difference in passing currents between said first and second data lines; wherein
said dummy cell includes a plurality of dummy magneto-resistance elements each having substantially the same characteristic as said magneto-resistance element; and
each of said dummy magneto-resistance elements is connected to said second data line via another dummy magneto-resistance element connected in series, and a voltage applied to opposite ends of each said dummy magneto-resistance element is smaller than that applied to said magneto-resistance element on said data reading.

2. The thin film magnetic memory device according to claim 1, wherein
each said dummy magneto-resistance element holds stored data corresponding to said first electric resistance of each said memory cell.

3. The thin film magnetic memory device according to claim 1, wherein
said dummy cell has L (L: an integer equal to or larger than 2) resistance groups connected to each other in parallel for said second data line, and
each said resistance group has L said dummy magneto-resistance elements connected to each other in series.

4. The thin film magnetic memory device according to claim 3, wherein
said dummy cell further includes
a connection control element to electrically couple one of connection nodes of said L dummy magneto-resistance elements connected to each other in series and included in each said resistance group, and one of connection nodes of said L dummy magneto-resistance elements connected to each other in series and included in another said resistance group.

5. The thin film magnetic memory device according to claim 1, wherein
at least one of said plurality of dummy magneto-resistance elements included in said dummy cell holds stored data corresponding to said second electric resistance of each said memory cell, and
each of the remaining dummy magneto-resistance elements holds stored data corresponding to said first electric resistance of each said memory cell.

6. The thin film magnetic memory device according to claim 1, wherein
a prescribed one of said plurality of dummy magneto-resistance elements holds stored data corresponding to said first electric resistance of each said memory cell, and
the remaining dummy magneto-resistance elements of said plurality of dummy magneto-resistance elements are connected parallel to each other, and each is connected to said prescribed one dummy magneto-resistance element in series.

7. The thin film magnetic memory device according to claim 6, wherein
the number of said remaining dummy magneto-resistance elements is set such that a combined resistance value of said plurality of dummy magneto-resistance elements will become smaller than a designed value of electric resistance of said dummy cell, when each of said remaining dummy magneto-resistance elements holds stored data corresponding to said first electric resistance of each said memory cell.

8. The thin film magnetic memory device according to claim 6, wherein
at least one of said remaining dummy magneto-resistance elements holds stored data corresponding to said second electric resistance of each said memory cell,
other said remaining dummy magneto-resistance elements hold stored data corresponding to said first electric resistance of each said memory cell, and
number of said remaining dummy magneto-resistance elements is set such that a combined resistance value of said plurality of dummy magneto-resistance elements will be a designed value of electric resistance of said dummy cell.

9. The thin film magnetic memory device according to claim 1, wherein each of said plurality of dummy magneto-resistance elements and said magneto-resistance element includes a first magnetic film having a fixed direction of magnetization, a second magnetic film magnetized in one of the same and opposite directions to said first magnetic film corresponding to said stored data, and an insulator film formed between said first and second magnetic films, said thin film magnetic memory device further comprising:

a conductive wiring to electrically couple said first magnetic film of each said dummy magneto-resistance element and said first magnetic film of said another dummy magneto-resistance element connected in series.

10. The thin film magnetic memory device according to claim 1, wherein each of said plurality of dummy magneto-resistance elements and said magneto-resistance element includes a first magnetic film having a fixed direction of magnetization, a second magnetic film magnetized in one of the same and opposite directions to said first magnetic film corresponding to said stored data, and an insulator film formed between said first and second magnetic films;

said thin film magnetic memory device further comprising a conductive wiring to electrically couple said first magnetic film of each said dummy magneto-resistance element and said second magnetic film of said another dummy magneto-resistance element connected in series.

11. A thin film magnetic memory device, comprising:

a plurality of memory cells arranged in rows and columns, each memory cell holding magnetically-written stored data;

a plurality of read word lines provided corresponding to respective rows of said plurality of memory cells and selectively activated on data reading; and a plurality of first data lines provided corresponding to respective columns of said plurality of memory cells, each of said first data lines being selectively connected to a selected memory cell among said plurality of memory cells and receiving data read current on data reading; wherein each said memory cell includes a magneto-resistance element having one of a first electric resistance and a second electric resistance larger than said first electric resistance corresponding to said stored data, and an access element connected with said magneto-resistance element in series between corresponding first data line and a prescribed voltage, and turned on in response to activation of corresponding read word line, wherein each of said first and second electric resistances has a characteristic which changes corresponding to a voltage applied to opposite ends of said magneto-resistance element;

said thin film magnetic memory device further comprising:

a dummy cell designed to have an intermediate electric resistance between said first and second electric resistances;

a second data line connected to said dummy cell to allow said data read current to pass therethrough on data reading; and a data read circuit generating read data based on a difference in passing currents between one of said plurality of first data lines and said second data line; wherein each said dummy cell includes a prescribed number of dummy cell units among a plurality of dummy cell units divided into a plurality of groups arranged along a column direction so as to share a memory cell row with said plurality of memory cells, each said dummy cell unit is arranged corresponding to a memory cell row so as to share said second data line, each said dummy cell unit has a first dummy magneto-resistance element connected between said second data line and an inner node, and a dummy access element turned on in response to activation of corresponding read word line and electrically couples said prescribed voltage and said first dummy magneto-resistance element, and said inner node is electrically coupled to each said inner node within another dummy cell unit belonging to the same group among said plurality of groups.

12. The thin film magnetic memory device according to claim 11, wherein each said dummy cell unit has a second dummy magneto-resistance element arranged between said inner node and said dummy access element.

13. The thin film magnetic memory device according to claim 11, wherein the number of said plurality of dummy cell units is larger than the number of said memory cells included in each said column;

said thin film magnetic memory device further comprising a plurality of redundant memory cells arranged in rows and columns in a region adjacent to said plurality of dummy cell units and said plurality of memory cells to repair a defective memory cell in said plurality of memory cells; wherein said plurality of redundant memory cells form a redundant memory cell row provided to each row, each said redundant memory cell row being arranged corresponding to each said dummy cell unit redundantly arranged along a column direction.

* * * * *

UNITED STATES PATENT AND TRADEMARK OFFICE
CERTIFICATE OF CORRECTION

PATENT NO. : 6,856,537 B2
DATED : February 15, 2005
INVENTOR(S) : Hiroaki Tanizaki et al.

It is certified that error appears in the above-identified patent and that said Letters Patent is hereby corrected as shown below:

Title page,
Item [56], References Cited, U.S. PATENT DOCUMENTS, change "6,382,823" to -- 6,392,923 --

Signed and Sealed this

Thirty-first Day of May, 2005

JON W. DUDAS
*Director of the United States Patent and Trademark Office*